US005956431A

United States Patent [19]

Iourcha et al.

[11] Patent Number: 5,956,431
[45] Date of Patent: Sep. 21, 1999

[54] SYSTEM AND METHOD FOR FIXED-RATE BLOCK-BASED IMAGE COMPRESSION WITH INFERRED PIXEL VALUES

[75] Inventors: Konstantine I. Iourcha, San Jose; Krishna S. Nayak, Stanford; Zhou Hong, San Jose, all of Calif.

[73] Assignee: S3 Incorporated, Santa Clara, Calif.

[21] Appl. No.: 08/942,860

[22] Filed: Oct. 2, 1997

[51] Int. Cl.[6] .................................................. G06K 9/36
[52] U.S. Cl. ........................ 382/253; 382/166; 382/232; 382/233
[58] Field of Search .................................. 382/253, 166, 382/233, 232, 236, 238, 239; 358/539, 425, 426, 427, 430

[56] References Cited

U.S. PATENT DOCUMENTS

| | | | |
|---|---|---|---|
| 5,734,744 | 3/1998 | Wittenstein et al. | 382/166 |
| 5,822,465 | 10/1998 | Normile et al. | 382/253 |

OTHER PUBLICATIONS

A. Schilling, et al.; "Texram: A Smart Memory for Texturing"; IEEE Computer Graphics & Applications; May 1996; 16(3) pp. 9–19.

G. Knittel, et al.; "Hardware and Software for Superior Texture Performance"; In 10; Eurographics Hardware Workshop '95; Maastricht, NL; Aug. 28–29, 1995; pp. 1–8.

G. Campbell, et al.; "Two Bit/Pixel Full Color Encoding"; Computer Graphics, (Proc. Siggraph '86); Aug. 18–22, 1986; vol. 20, No. 4, Dallas TX; pp. 215–219.

*Primary Examiner*—Edward L. Coles
*Assistant Examiner*—Jimmy Nguyen
*Attorney, Agent, or Firm*—Fenwick & West LLP

[57] ABSTRACT

An image processing system includes an image encoder system and a image decoder system that are coupled together. The image encoder system includes a block decomposer and a block encoder that are coupled together. The block encoder includes a color quantizer and a bitmap construction module. The block decomposer breaks an original image into blocks. Each block is then processed by the block encoder. Specifically, the color quantizer selects some number of base points, or codewords, that serve as reference pixel values, such as colors, from which quantized pixel values are derived. The bitmap construction module then maps each pixel colors to one of the derived quantized colors. The codewords and bitmap are output as encoded image blocks. The decoder system includes a block decoder. The block decoder includes a block type detector, one or more decoder units, and an output selector. Using the codewords of the encoded data blocks, the comparator and the decoder units determine the quantized colors for the encoded image block and map each pixel to one of the quantized colors. The output selector outputs the appropriate color, which is ordered in an image composer with the other decoded blocks to output an image representative of the original image. A method for encoding an original image and for decoding the encoded image to generate a representation of the original image is also disclosed.

22 Claims, 16 Drawing Sheets

318

SYSTEM AND METHOD FOR FIXED-RATE BLOCK-BASED IMAGE COMPRESSION WITH INFERRED PIXEL VALUES

BACKGROUND OF THE INVENTION

1. Field of the Invention

The present invention relates to image processing systems, and more specifically, to three-dimensional rendering systems using fixed-rate image compression for textures.

2. Description of the Related Art

The art of generating images, such as realistic or animated graphics on a computer is known. To generate such images requires tremendous memory bandwidth and processing power on a graphics subsystem. To reduce the bandwidth and processing power requirements, various compression methods and systems were developed. These methods and systems included Entropy or lossless encoders, discrete cosine transform or JPEG type compressors, block truncation coding, color cell compression, and others. Each of these methods and systems, however, have numerous drawbacks.

Entropy or lossless encoders include Lempel-Ziv encoders and are used for many different purposes. Entropy coding relies on predictability. For data compression using Entropy encoders, a few bits are used to encode the most commonly occurring symbols. In stationary systems where the probabilities are fixed, Entropy coding provides a lower bound for the compression than can be achieved with a given alphabet of symbols. A problem with Entropy coding is that it does not allow random access to any given symbol. The part of the compressed data preceding a symbol of interest must be first fetched and decompressed to decode the symbol which takes considerable processing time and resources as well as decreasing memory throughput. Another problem with existing Entropy methods and systems is that they do not provide any guaranteed compression factor which makes this type of encoding scheme impractical where the memory size is fixed.

Discrete Cosine Transform ("DCT") or JPEG-type compressors, allow users to select a level of image quality. With DCT, uncorrelated coefficients are produced so that each coefficient can be treated independently without loss of compression efficiency. The DCT coefficients can be quantized using visually-weighted quantization values which selectively discard the least important information.

DCT, however, suffers from a number of shortcomings. One problem with DCT and JPEG-type compressors is that they require usually bigger blocks of pixels, typically 8×8 or 16×16 pixels, as a minimally accessible unit in order to obtain a reasonable compression factor and quality. Access to a very small area, or even a single pixel involves fetching a large quantity of compressed data, thus requiring increased processor power and memory bandwidth. A second problem with DCT and JPEG-type compressors is that the compression factor is variable, therefore requiring a complicated memory management system that, in turn, requires greater processor resources. A third problem with DCT and JPEG-type compression is that using a large compression factor significantly degrades image quality. For example, the image may be considerably distorted with a form of a ringing around the edges in the image as well as noticeable color shifts in areas of the image. Neither artifact can be removed with subsequent low-pass filtering.

A fourth problem with DCT and JPEG-type compression is that such a decompressor is complex and has a significant associated hardware cost. Further, the high latency of the decompressor results in a large additional hardware cost for buffering throughout the system to compensate for the latency. Finally, a A fifth problem with DCT and JPEG-type compressors is that it is not clear whether a color keyed image can be compressed with such a method and system.

Block truncation coding ("BTC") and color cell compression ("CCC") use a local one-bit quantizer on 4×4 pixel blocks. The compressed data for such a block consists of only two colors and 16-bits that indicate which one of the two colors is assigned to each of the 16 pixels. Decoding a BTC/CCC image consists of using a multiplexer with a look-up table so that once a 16-texel-block (32-bits) is retrieved from memory, the individual pixels are decoded by looking up the two possible colors for that block and selecting the color according to the associated bit from the 16 decision bits.

The BTC/CCC methods quantize each block to just two color levels resulting in significant image degradation. Further, a two-bit variation of CCC stores the two colors as eight-bit indices into a 256-entry color lookup table. Thus, such pixel blocks cannot be decoded without fetching additional information that can consume additional memory bandwidth.

The BTC/CCC methods and systems can use a three-bit per pixel scheme which store the two colors as 16-bit values (not indices into a table) resulting in pixel blocks of six bytes. Fetching such units, however, decreases system performance because of additional overhead due to memory misalignment. Another problem with BTC/CCC is that when it is used to compress images that use color keying to indicate transparent pixels, there will be a high degradation of image quality.

Therefore, there is a need for a method and system that maximizes the accuracy of compressed images while minimizing storage, memory bandwidth requirements, and decoding hardware complexities, while also compressing image data blocks into convenient sizes to maintain alignment for random access to any one or more pixels.

SUMMARY OF THE INVENTION

An image processing system includes an image encoder or compression system and an image decoder or decompression system that are coupled together. The image encoder system receives an original image from a source and encodes the original image into a compressed form that is reduced in size and that represents the original image with minimal loss of image quality. The image decoder system decodes the encoded image to generate an output representing the original image.

The image encoder system includes an image decomposer that is coupled to one or more block encoders. The one or more block encoders are, in turn, coupled to an encoded image composer. The encoded image composer is coupled to an output. In addition, the image decomposer and the encoded image composer are coupled to a header converter. The output of the encoded image composer may be coupled with a storage device, a memory, or a data transmission line, for example.

The image decomposer breaks the original image into its header and some number of image blocks. The header is forwarded to the header converter which modifies the header and forwards it to the encoded image composer. Each image block has a fixed size, e.g., four-by-four pixels, and is forwarded to the one or more block encoders. The block encoders convert the image block into a compressed or encoded block form, which is also of a fixed size. The encoded image composer orders the encoded image blocks and concatenates them with the modified header to produce an output that is an encoded image data representing the original image.

Each block encoder includes a color quantizer and a bitmap construction module that are coupled together. Further, the color quantizer includes a block type module, a curve selection module, and a codeword generation module. The block type module is coupled to the curve selection module and the curve selection module is coupled to the codeword generation module.

In a preferred embodiment, the block type module identifies which one of two color sets, which comprise either four quantized pixel values (e.g., colors) or three quantized pixel values (e.g., colors) and a transparency, is to be used for the encoding of each data block received from the block decomposer. The curve selection module and the codeword generation module function to select two base colors, or codewords, that may be used to identify the color set to which each pixel in the image block is mapped.

In a preferred embodiment, the set of colors are equidistant along a line in a color space. In addition, the two endpoint quantized colors are used as the codewords themselves, and the remaining one or two quantized colors are inferred or interpolated. If one quantized color is inferred, the fourth reference may be a transparency.

Once the codewords and quantized colors are identified, the bitmap construction module constructs a bitmap value for each pixel in the block. Each pixel's bitmap value is an index (identified as an ID value) indicating which of the quantized colors best matches the pixel. The bitmap construction module outputs the bitmap and the codewords as a single encoded image block. In a preferred embodiment, each bitmap value is two-bits, comprising a bitmap of 32-bits, which along with two 16-bit codewords form a 64-bit encoded image block.

Each of the encoded image data blocks from a block encoder is then ordered in the encoded image composer to generate a data file of the encoded image blocks. The data file of the encoded image blocks is concatenated with the header information from the original image data to generate the encoded or compressed image data. The encode image data may then be decoded or decompressed in the image decoder system.

The image decoder system includes an encoded image decomposer, a header converter, one or more block decoders, and an image composer. The encoded image decomposer is coupled to the header converter and the one or more block decoders. The image composer is coupled to the one or more block decoders and the header converter. The image composer is coupled to output an image representing the original image.

The encoded image data is received by the encoded image decomposer that decomposes, or breaks, the encoded image data into its header and its encoded image blocks. The header is forwarded to the header converter which modifies the header and forwards it to the image composer. The one or more encoded image blocks are independently decoded by one or more block decoders. The image composer orders the decoded image blocks into a data file of decoded image blocks. The data file is concatenated with the header from the header converter and the entire file is output as an image representing the original image.

Each block decoder includes a block type detector, a decoder unit for each block type, and an output selector. The block type detector is coupled with each decoder unit and the output selector. In addition, each decoder unit is coupled with the output selector. The block type detector determines which decoder unit is selected to decode the encoded block. In a preferred embodiment, the block type is determined through an arithmetic comparison of the encoded block's codewords.

Based on the selected decoder, the quantized colors are inferred from the codewords for the encoded block. An index value (ID value) for each pixel in the block is read from the bitmap data string to map each pixel to the appropriate quantized color. The colors for each pixel in the block are output to the output selector. The output selector sends the appropriate decoded block to the image composer for ordering to generate the final image at the output.

The present invention also provides for decoding only portions of the encoded image by allowing for random access to portions of the image. Thus, the present invention advantageously can decode an encoded image in a particular order and portion. For example, in a three-dimensional graphics environments, the present invention can select parts of the encoded image used for texture maps.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

DETAILED DESCRIPTION OF THE PREFERRED EMBODIMENTS

Figure 1:
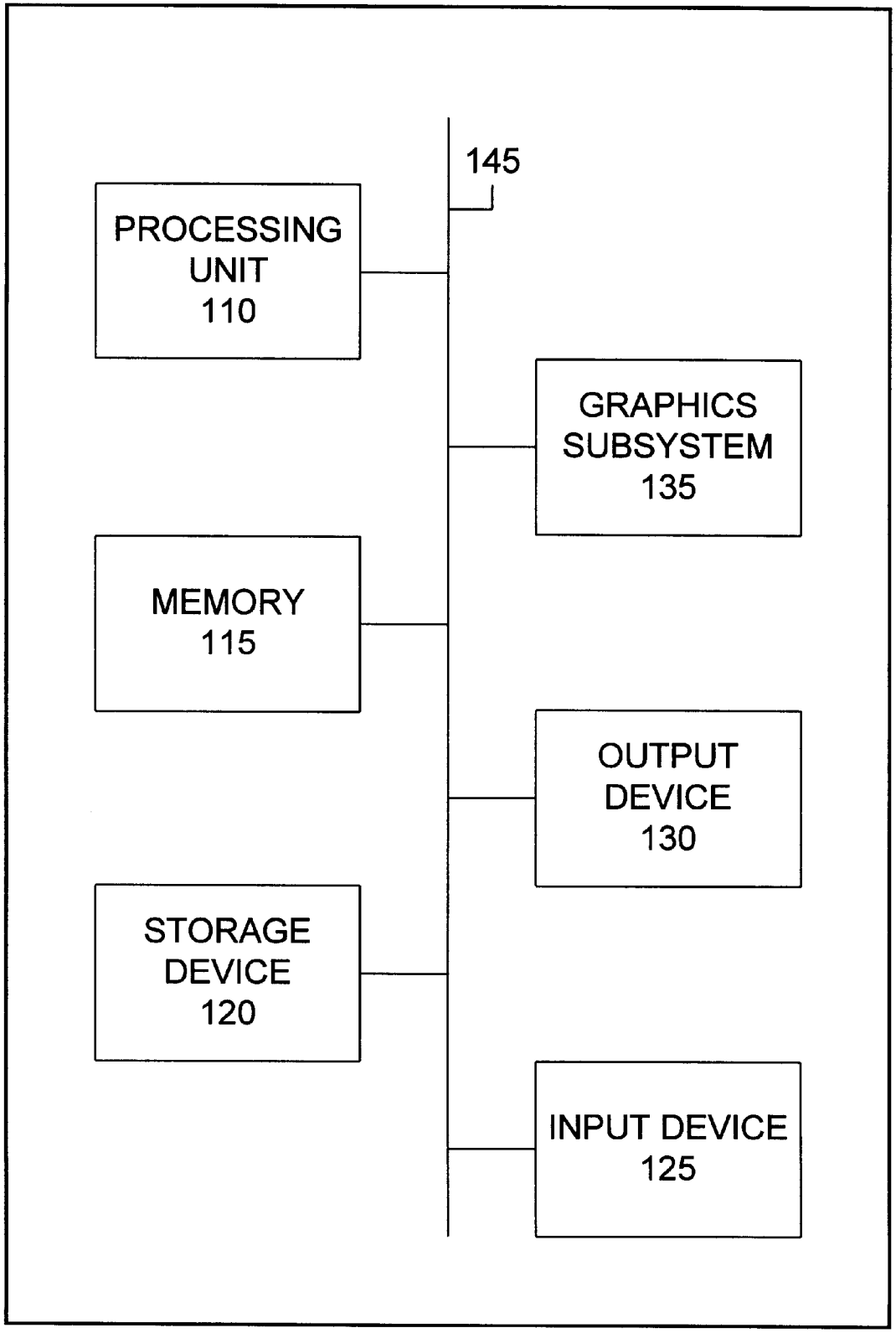
FIG. 1 is a block diagram of a data processing system in accordance with the present invention.

FIG. 1 is a block diagram of a data processing system 105 constructed in accordance with the present invention. The data processing system 105 includes a processing unit 110, a memory 115, a storage device 120, an input device 125, an output device 130, and a graphics subsystem 135. In addition, the data processing system 105 includes a data bus 145 that couples each of the other components 110, 115, 120, 125, 130, 135 of the data processing system 105.

The data bus 145 is a conventional data bus and while shown as a single line it may be a combination of a processor bus, a PCI bus, a graphical bus, and an ISA bus. The processing unit 110 is a conventional processing unit such as the Intel Pentium processor, Sun SPARC processor, or Motorola PowerPC processor, for example. The processing unit 110 processes data within the data processing system 105. The memory 115, the storage device 120, the input device 125, and the output device 130 are also conventional components as recognized by those skilled in the art. The memory 115 and storage device 120 store data within the data processing system 105. The input device 125 inputs data into the system while the output device 130 receives data from the data processing system 105.

Figure 2A:
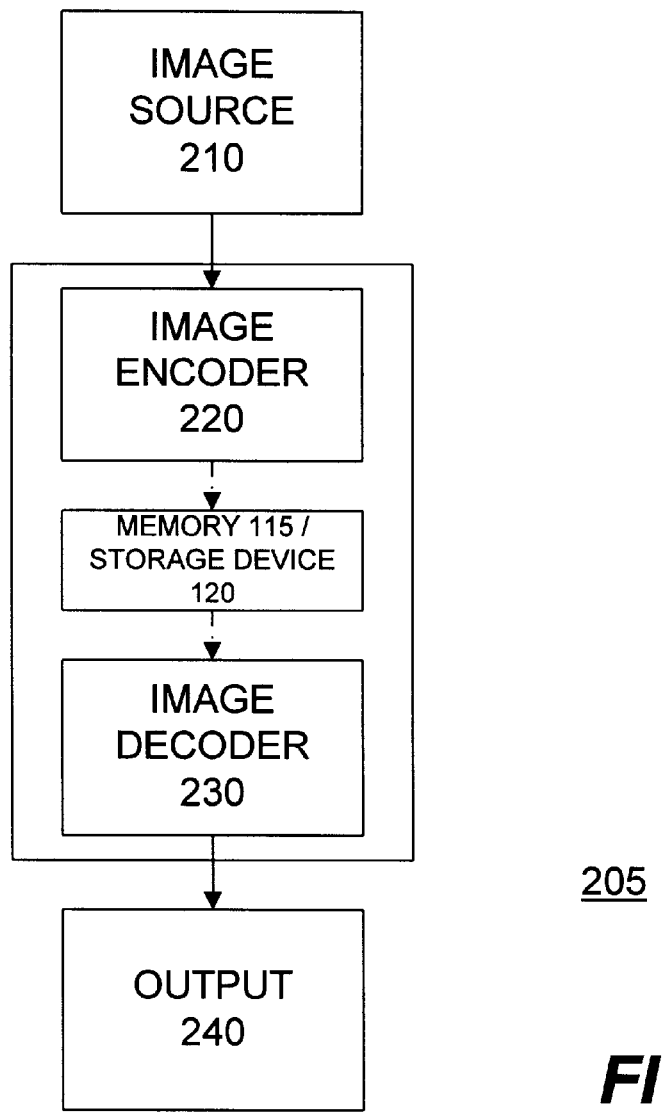
FIG. 2A is a block diagram of an image processing system in accordance with the present invention.

FIG. 2A is a block diagram of an image processing system 205 constructed in accordance with the present invention. In one embodiment, the image processing system 205 runs within the data processing system 105. The image processing system 205 includes an image encoder system 220 and an image decoder system 230. The image processing system 205 may also include a unit for producing an image source 210 from which images are received, and an output 240 to which processed images are forwarded for storage or further processing. The image encoder system 220 is coupled to receive an image from the image source 210. The image decoder system 230 is coupled to output the image produced by the image processing system 205. The image encoder system 220 is coupled to the image decoder system 230 through a data line and may be coupled via a storage device 120 and/or a memory 115, for example.

Within the image encoder system 220, the image is broken down into individual blocks and processed before being forwarded to, e.g., the storage device 140, as compressed or encoded image data. When the encoded image data is ready for further data processing, the encoded image data is forwarded to the image decoder system 230. The image decoder system 230 receives the encoded image data and decodes it to generate an output that is a representation of the original image that was received from the image source 210.

Figure 3A:
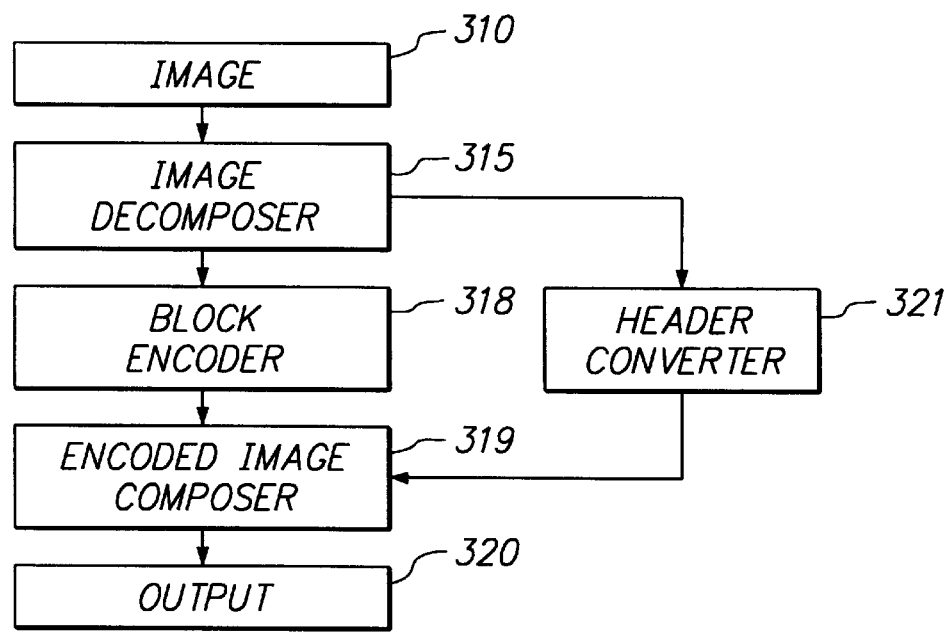
FIG. 3A is a block diagram of a first embodiment an image encoder system in accordance with the present invention.
Figure 3B:
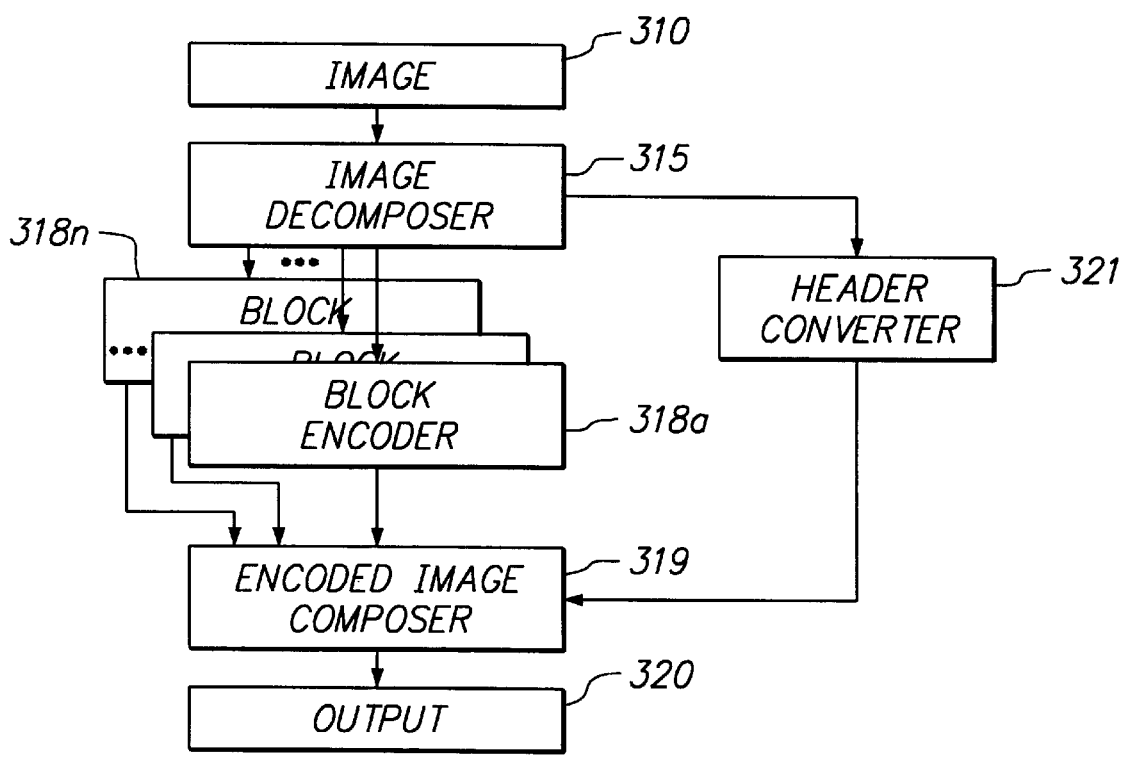
FIG. 3B is a block diagram of a second embodiment of an image encoder system in accordance with the present invention.

FIGS. 3A and 3B are block diagrams illustrating two separate embodiments of the image encoder system 220 of the present invention. The image encoder system 220 includes an image decomposer 315, a header converter 321, one or more block encoders 318 (318a–318n, where n is the nth encoder, n being any positive integer), and an encoded image composer 319. The image decomposer 315 is coupled to receive an original image 310 from a source, such as the image source 210. The image decomposer 315 is also coupled to the one or more block encoders 318 and to the header converter 321. The header converter 321 is also coupled to the encoded image composer 319. Each block encoder 318 is also coupled to the encoded image composer 319. The encoded image composer 319 is coupled to the output 320.

The image decomposer 315 receives the original image 310 and forwards information from a header of the original image 310 to the header converter 321. The header converter 321 modifies the original header to generate a modified header, as further described below. The image decomposer 315 also breaks, or decomposes, the original image 310 into R number of image blocks, where R is some integer value. The number of image blocks an original image 310 is broken into may depend on the number of image pixels. For example, in a preferred embodiment an image 310 comprised of A image pixels by B image pixels will typically be (A/4) * (B/4) blocks, where A and B are integer values. For example, where an image is 256 pixels by 256 pixels, there will be 64×64 blocks. In other words, the image is decomposed such that each image block is 4 pixels by 4 pixels (16 pixels). Those skilled in the art will recognize that the number of pixels or the image block size may be varied, for example m×n pixels, where m and n are positive integer values.

Figure 2B:
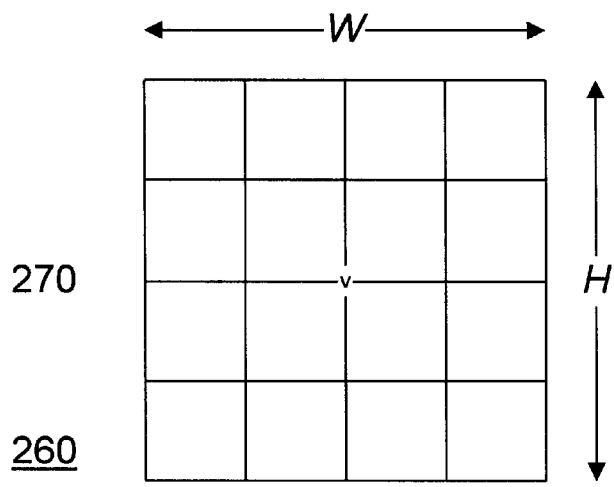
FIG. 2B is a graphical representation of an image block in accordance with the present invention.

Briefly turning to FIG. 2B, there is illustrated an example of a single image block 260 in accordance with the present invention. The image block 260 is comprised of pixels 270. The image block 260 may be defined as an image region W pixels 270 in width by H pixels 270 in height, where W and H are integer values. In a preferred embodiment, the image block 260 is comprised of W=4 pixels 270 by H=4 pixels 270 (4×4).

Turning back to FIGS. 3A and 3B, each block encoder 318 receives an image block 260 from the image decomposer 315. Each block encoder 318 encodes or compresses each image block 260 that it receives to generate an encoded or compressed image block. Each encoded image block is received by the encoded image composer 319 which orders the encoded blocks in a data file. The data file from the encoded image composer 319 is concatenated with a modified header from the header converter 321 to generate an encoded image data file that is forwarded to the output 320. Further, it is noted that having more than one block encoder 318a–318n allows for encoding multiple image blocks simultaneously, one image block per block encoder 318a–318n, within the image encoder system 220 to increase image processing efficiency and performance.

The modified header and the encoded image blocks together form the encoded image data that represents the original image 310. The function of each element of the image encoder system 220, including the block encoder 318, will be further described below with respect to FIGS. 4A–4E.

The original image 310 may be in any one of a variety of formats including red-green-blue ("RGB"), YUV 420, YUV 422, or a proprietary color space. It may be useful in some cases to convert to a different color space before encoding the original image 310. It is noted that in one embodiment of the present invention, each image block 260 is a 4×4 set of pixels where each pixel 270 is 24-bits in size. For each pixel 270 there are 8-bits for a Red(R)-channel, 8-bits for a Green(G)-channel, and 8-bits for a Blue(B)-channel in a red-green-blue ("RGB") implementation color space. Further, each encoded image block is also a 4×4 set of pixels, but, each pixel is only 2-bits in size and has an aggregate size of 4-bits as will be further described below.

Figure 3C:
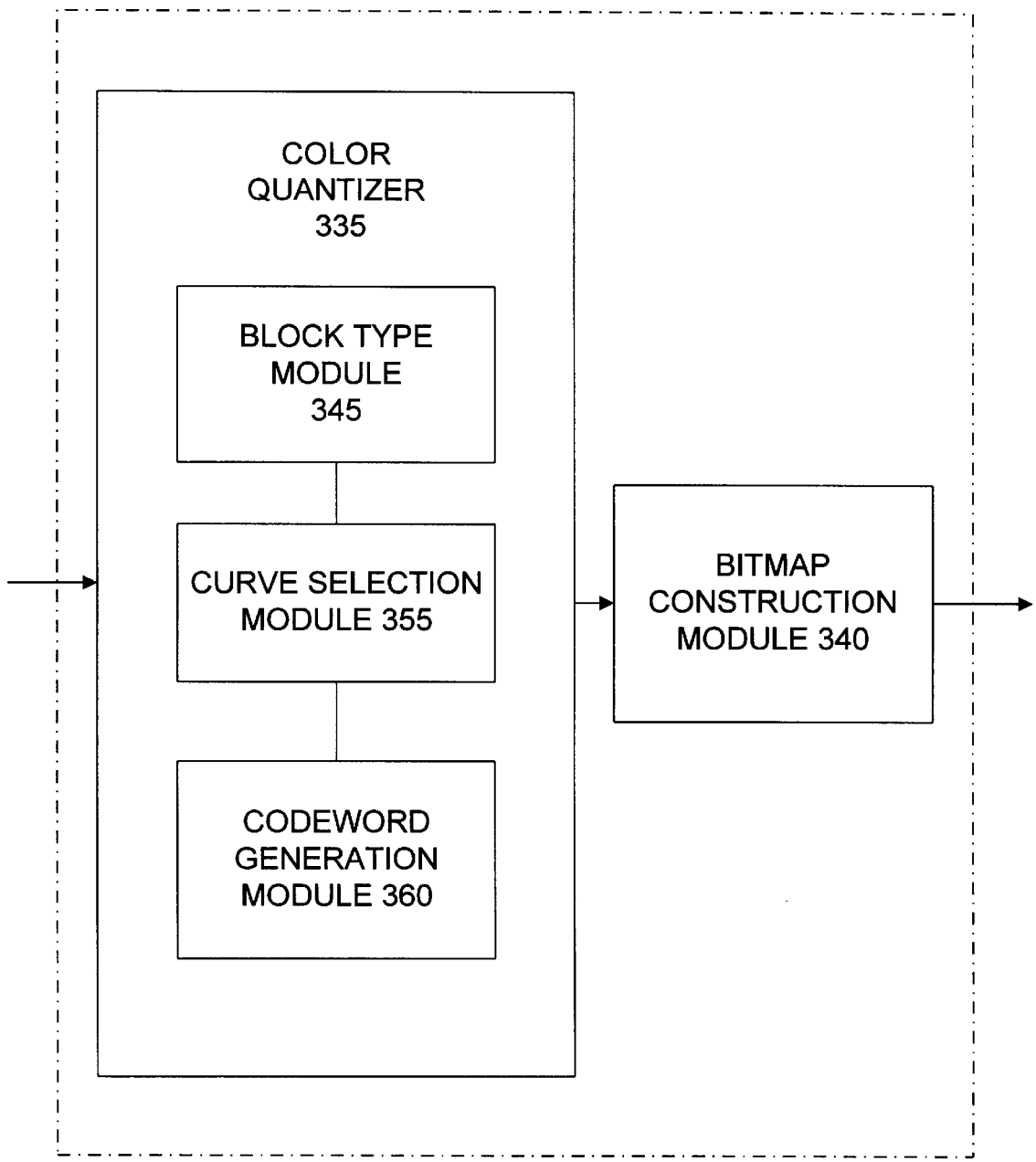
FIG. 3C is a block diagram of an image block encoder in accordance with the present invention.

FIG. 3C is a block diagram illustrating a block encoder 318 of the present invention in greater detail. The block encoder 318 includes a color quantizer 335 and a bitmap construction module 340. The color quantizer 335 is coupled to the bitmap construction module 340. Further, the color quantizer 335 further emphasizes a block type module 345, a curve selection module 355, and a codeword generation module 360. The block type module 345 is coupled to the curve selection module 355. The curve selection module 355 is coupled to the codeword generation module 360.

Each image block 260 of the decomposed original image 310 is received and initially processed by the color quantizer 335 before being forwarded to the bitmap construction module 340 for further processing. The bitmap construction module 340 outputs encoded image blocks for the encoded image composer 319 to order. The bitmap construction module 340 and the color quantizer 335, including the block type module 345, the curve selection module 355, and the codeword generation module 360, are further discussed below in FIGS. 4A–4E.

Figure 3D:
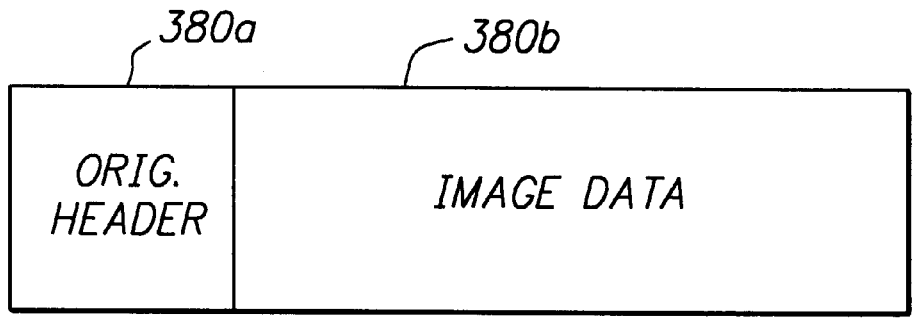
FIG. 3D is a data sequence diagram of an original image in accordance with the present invention.

Briefly, FIG. 3D is a diagram of a data sequence or string 380 representing the original image 310 that is received by the block decomposer 315. The data string 380 of the original image 310 includes an α-bit header 380a and a b-bit image data 380b, where a and b are integer values. The header 380a may include information such as the pixel width of the image 310, the pixel height of the image 310, and the format of the image 310, e.g., the number of bits to the pixel in RGB or YUV format, for example, as well as other information. The image data is the data 380b representing the original image 310 itself.

Figure 3E:
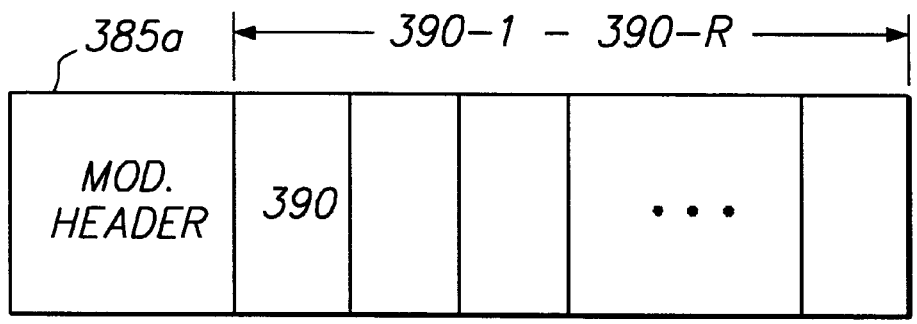
FIG. 3E is a data sequence diagram of encoded image data of the original image output from the image encoder system in accordance with the present invention.

FIG. 3E is a diagram of a data sequence or string 385 representing encoded image data 385 that is generated and output 320 by the image encoder system 220. The data string for the encoded image data 385 includes a modified header portion 385a and an encoded image block portion 390-1–390-R. The modified header portion 385a is generated by the header converter 321 from the original header 380a for the original image 310. The modified header generated by the header converter 321 includes information about file type, a number of bits per pixel of the original image 310, addressing into the original image 310, other miscellaneous encoding parameters, as well as the width and height information indicating the size of that original image 310. The encoded image block portion 390- 1-R includes the encoded image blocks 390-1–390-R from the block encoders 318, where R is an integer value that is the number of blocks resulting from the decomposed original image 310.

Figure 3F:
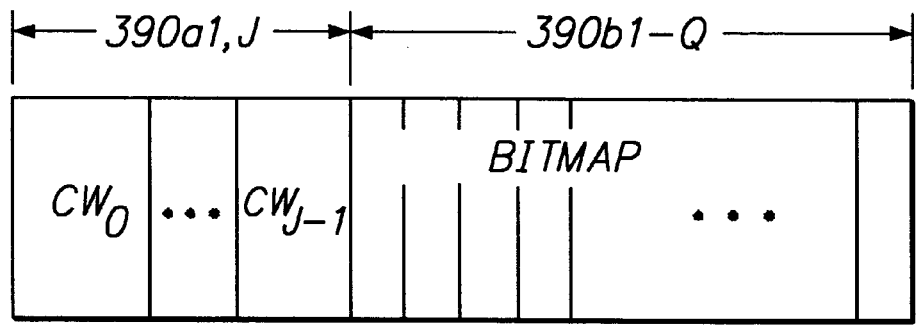
FIG. 3F is a data sequence diagram of an encoded image block from the image block encoder in accordance with the present invention.

FIG. 3F is a diagram of a data sequence or string 390 representing an encoded image block in accordance with the present invention. It is understood that the data string 390 representing the encoded image block may be similar to any one of the encoded image blocks 390-1–390-R shown in the encoded image data string 385.

The data string 390 of the encoded image block includes a codeword section 390a which includes J codewords, where J is an integer value, and a bitmap section 390b. The codeword section 390a includes J codewords 390a that are used to compute the colors indexed by the bitmap 390b. A codeword is a n-bit data string, where n is an integer value, that identifies a pixel property, for example a color component. In a preferred embodiment, there are two 16-bit codewords 390a, CW0, CW1 (J=2). The bitmap is a Q-bit data portion and is further discussed below in FIG. 4B.

Further, in a preferred embodiment, each encoded image block is 64-bits, which includes two 16-bit codewords and a 32-bit (4×4×2 bit) bitmap 395. Encoding the image block 260 as described provides greater system flexibility and increased data processing efficiency as will be further discussed below.

Figures 4A, 4B:
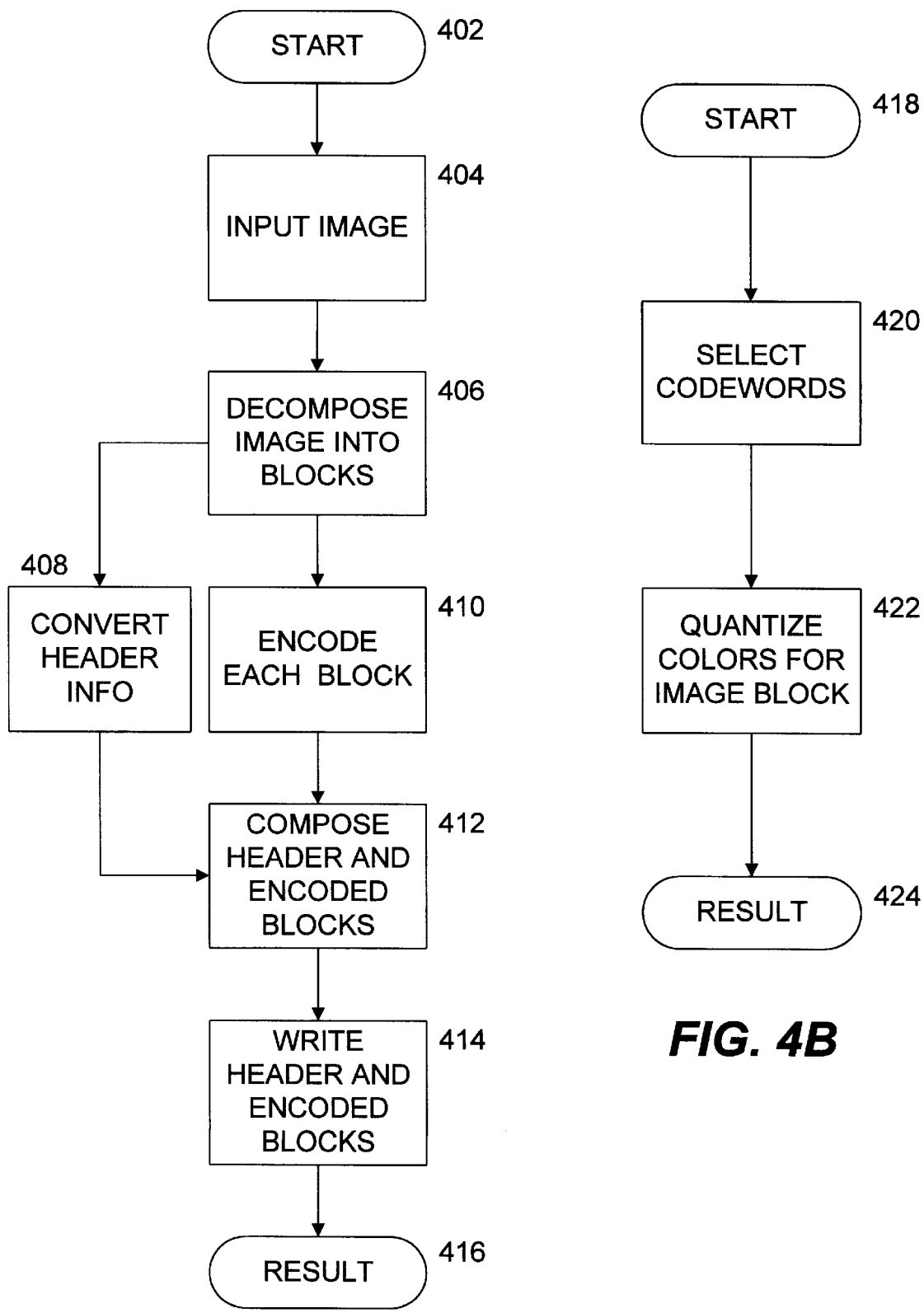
FIGS. 4A–4E are flow diagrams illustrating an encoding process in accordance with the present invention.

FIGS. 4A–4E describe the operation of the image encoder system 220. FIG. 4A describes the general operation of the image encoder system 220. At the start 402 of operation, data string 380 of the original image 310, that includes the α-bit header 380a and the b-bit image data 380b, is input 404 into the block decomposer 315 from the image source 210. The block decomposer 315 decomposes 406 the original image 310 to extract the α-bit header 380a and forward it to the header converter 321. The block decomposer also 315 decomposes, 406 the original image 310 into image blocks. Each image block 260 is independently compressed, or encoded, 410 in the one or more block encoders 318.

The header converter 321 converts 408 the α-bit header to generate a modified header 385a. The modified header 385a is forwarded to the encoded image composer 319. Simultaneous with the header converter 321 converting 408 the α-bit header, each image block is encoded 410 by the one or more image encoders 318a–318n to generate the encoded image blocks 390-1–390-R. Again, it is noted that each image block 260 may be processed sequentially in one block encoder 318a or multiple image blocks 260 may be processed in parallel in multiple block encoders 318a–318n.

The encoded image blocks 390 are output from the block encoders 318 and are placed into a predefined order by the encoded image composer 319. In a preferred embodiment, the encoded image blocks 390 are ordered in a file from left to right and top to bottom in the same order in which they were broken clown by the block decomposer 315. The image encoder system 220 continues by composing 412 the modified header information 385a from the header converter 321 and the encoded image blocks 390. Specifically, the modified header 385a and the ordered encoded image blocks 390 are concatenated to generate the encoded image data file 385. The encoded image data file 385 is written 414 as encoded output 320 to the memory 115, the storage device 120, or the output device 130, for example.

FIG. 4B shows the encoding process 410 for the encoder system 220 described above in FIG. 2. At the start 418 of operation, codewords are selected 420. As discussed above in FIG. 3F, in a preferred embodiment there are two codewords 390a, CW0, CW1. The process for selecting codewords is further described below in FIG. 4C.

Once the codewords are selected 420 pixel values or properties, such as colors, for the image block 260 are quantized 422. Specifically, the codewords 390a provide points in a pixel space from which M quantized pixel values may be inferred, where M is an integer value. The M quantized pixel values are a limited subset of pixels in a pixel space that are used to represent the current image block. The process for quantizing pixel values, and more specifically colors, will be described below in FIGS. 4D and 4E. Further, it is noted that the embodiments will now be described with respect to colors of a pixel value although one skilled in the art will recognize that in general any pixel value may be used with respect to the present invention.

In a preferred embodiment, each pixel is encoded with two bits of data which can index one of M quantized colors (M=4). Further, in a preferred embodiment the four quantized colors are derived from the two codewords 390a where two colors are the codewords themselves and the other two colors are inferred from the codewords, as will be described below. It is also possible to use the codewords 390a so that there is one index to indicate a transparent color and three indices to indicate colors, of which one color is inferred.

In a preferred embodiment, the bitmap 390b is a 32-bit data string. The bitmap 390b and codewords 390a are output 424 as a 64-bit data string representing an encoded image block 390. Specifically, the encoded image block 390 includes the two 16-bit codewords 390a (n=16) and a 32-bit bitmap 390b. Each codeword 390a CW0, CW1 that is a 16-bit data string includes a 5-bit red-channel, 6-bit green-channel, and 5-bit blue-channel.

Each of the encoded image blocks 390 is placed together 390a1–390aR, and concatenated with header information 385a derived from the original header 380a of the original image 310. The resulting 424 output is the encoded image data 385 representing the original image 310.

Figure 4C:
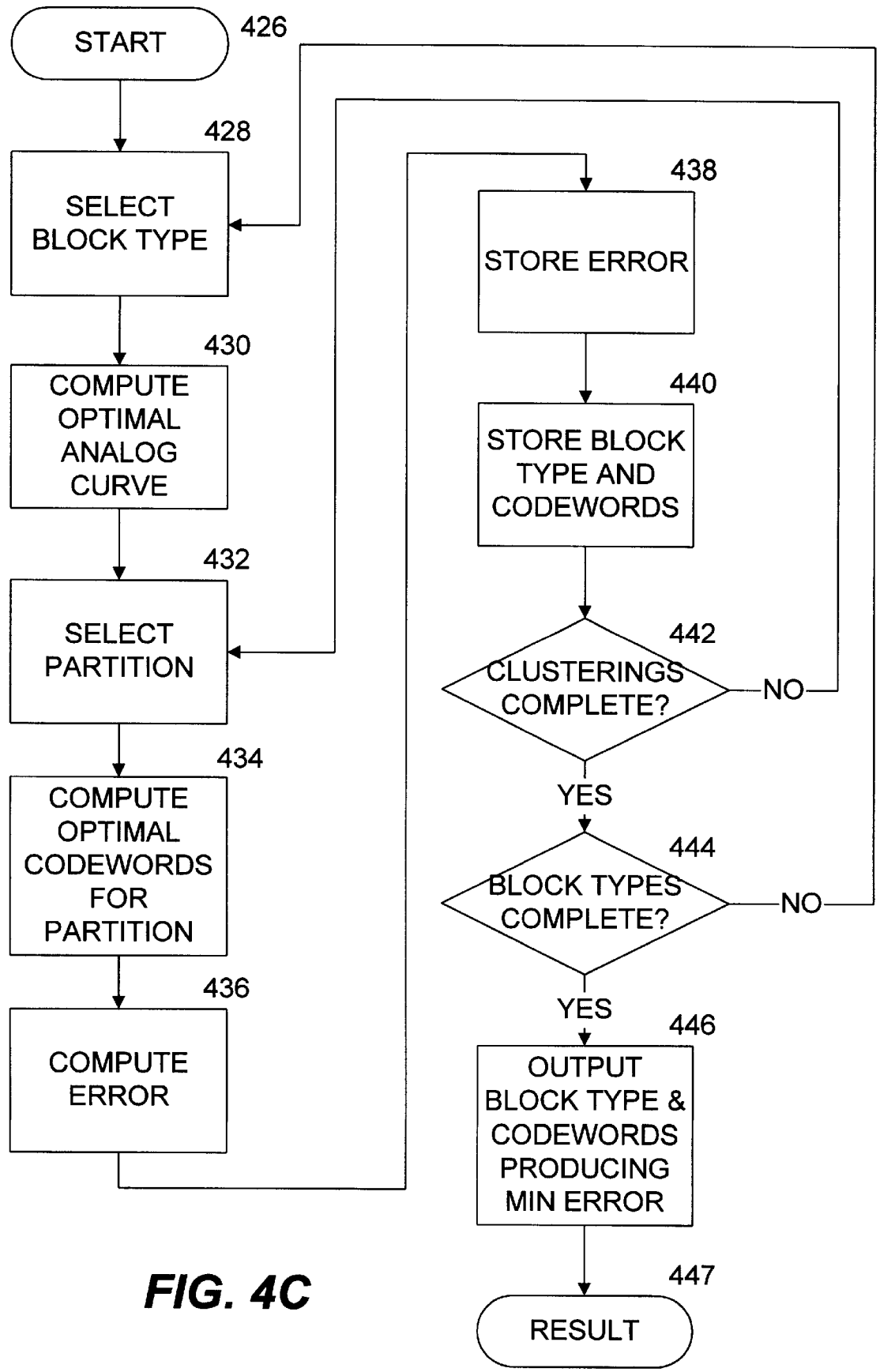

FIG. 4C describes the process for selecting 420 the codewords for the image blocks 260 in more detail. At the start 426 of the process, the color quantizer 335 uses the block type module 345 to select 428 the first block type for the image block 260 that is being processed. For example, one block type selected 428 may be a four-color and another block type selected 428 may be a three-color plus transparency, where the colors within the particular block type have equidistant spacing in a color space.

Once the block type is selected 428, the process computes 430 an optimal analog curve for the block type. Computation 430 of the optimal analog curve 430 will be further described below in FIG. 4D. The analog curve is used to simplify quantizing of the colors in the image block. After computing 430 the optimal analog curve, the process selects 432 a partition of the points along the analog curve. A partition may be defined as a grouping of indices {1 . . . (W×H)} into M nonintersecting sets. In a preferred embodiment, the indices (1 . . . 16) are divided into three or four groups, or clusters, (M=3 or 4) depending on the block type.

Once a partition is selected 432, the optimal codewords for that particular partition are computed 434. Computation 434 of the optimal codewords is further described below in FIG. 4E. In addition to computing 434 the codewords, an error value (squared error as describe below) for the codewords is also computed 436. Computation 436 of the error values is further described below with respect to FIG. 4E also. If the computed 436 error value is the first error value it is stored. Otherwise, the computed 436 error value is stored 438 only if it is less than the previously stored error value. For each stored 438 error value, the corresponding block type and codewords are also stored 440. It is noted that the process seeks to find the block type and codewords that minimize the error function.

The process continues by determining 442 if the all the possible partitions are complete. If there are more partitions possible, the process selects 432 the next partition and once again computes 434 the codewords, computes 436 the associated error value, and stores 438 the error value and stores 440 associated block type and codewords only if the error value is less than the previously stored error value.

After all the possible partitions are completed, the process determines 444 whether all the block types have been selected. If there are more block types, the process selects 428 the next block type. Once again, the process will compute 430 the optimal analog curve, select 432, 442 all the possible partitions, for each partition it will compute 434, 436 the codewords and associated error value, and store 438, 440 the error value and associated block type and codeword only if the error value is less than the previously stored error value. After the last block type is processed, the process outputs 446 a result 447 of the block type and codewords 390a having the minimum error.

In an alternative embodiment, the optimal analog curve may be computed 430 before searching the block type. That is, the process may compute 430 the optimal analog curve before proceeding with selecting 428 the block type, selecting 432 the partition, computing 434 the codewords, computing 436 the error, storing 438 the error, and storing 440 the block type and codeword. Computing 430 the optimal analog curve first is useful if all the block types use the same analog curve and color space because the analog curve does not need to be recomputed for each block type.

Figure 4D:
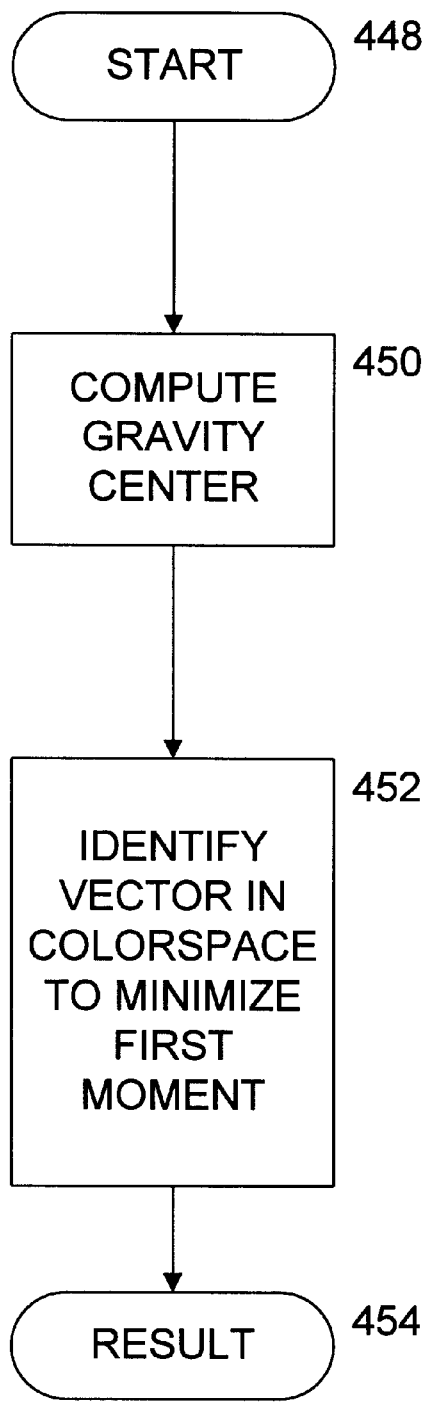

FIG. 4D further describes the process of identifying the optimal analog curve. The curve selection module 355 starts 448 the process by computing a center of gravity 450 for pixel 270 colors of an image block 260. Computing 450 the center of gravity includes averaging the pixel 270 colors of the image block 260. Once the center of gravity is computed 450, the process identifies 452 a vector in color space to minimize the first moment of the pixel 270 colors of the image block 260.

Specifically, for identifying 452 the vector the process fits a straight line to a set of data points, which are the original pixel 270 colors of the image block 260. A straight line is chosen passing through the center of gravity of the set of points such that it minimizes the "moment of inertia" (the means square error). For example, for three pixel properties, to compute the direction of the line minimizing the moment of inertia, tensor inertia, T, is calculated from the individual colors as follows:

$$T = \sum_{i=1}^{w \times w} \begin{pmatrix} C_{1i}^2 + C_{2i}^2 & -C_{0i}C_{1i} & -C_{0i}C_{2i} \\ -C_{0i}C_{1i} & C_{0i}^2 + C_{2i}^2 & -C_{1i}C_{2i} \\ -C_{0i}C_{2i} & -C_{2i}C_{1i} & C_{0i}^2 + C_{1i}^2 \end{pmatrix}$$

where $C_0$, $C_1$, and $C_2$ represent pixel properties, for example color components in RGB or YUV, relative to a center of gravity. In a preferred embodiment of an RGB color space, $C_{0i}$ is the value of red, $C_{1i}$ is the value of green, and $C_{2i}$ is the value of blue for each pixel, i, of the image block. Further, i takes on integer values from 1 to W×H, so that if W=4 and H=4, i ranges from 1 to 16.

The eigenvector of tensor, T, with the smallest eigenvalue is calculated using conventional methods known to those skilled in the art. The eigenvector direction along with the calculated gravity center, defines the axis that minimizes the moment of inertia. This axis is used as the optimal analog curve, which in a preferred embodiment is a straight line.

Figure 4E:
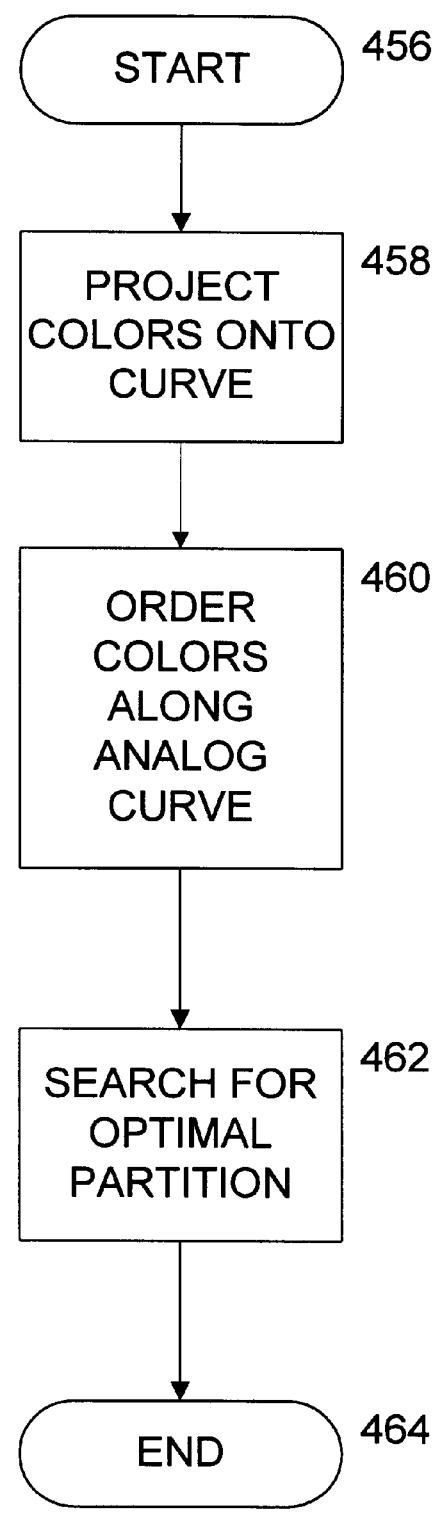

FIG. 4E illustrates the process undertaken by the codeword generation module 360 for selecting 432 the partitions, computing 434, 436 the codewords for the partitions and the associated error, and storing 438, 440 the error value, block type, and codeword if the error value is less than a previously stored error value. The process starts 456 with the codeword generation module 360 projecting 458 the W×H color values onto the previously constructed optimal analog curve. The value of W×H is the size in number of pixels 270 of an image block 260. In a preferred embodiment, where Wand Hare both 4 pixels, W×H is 16 pixels.

Once the colors are projected 458 onto the analog curve, the colors are ordered 460 sequentially along that analog curve based on the position of the color on the one-dimensional analog curve. After the colors are ordered 460, the codeword generation module 360 searches 462 for optimal partitions. That is, the codeword generation module 360 takes the W×H colors (one color associated with each pixel) that are ordered 460 along the analog curve and partitions, or groups, them into a finite number of clusters with a predefined relative spacing. In a preferred embodiment, where W=4 and H=4, so that W×H is 16, the 16 colors are placed in three or four clusters (M=3 or 4).

In conducting the search 462 for the optimal partition, the color selection module 360 finds the best M clusters for the W×H points projected onto the optimal curve, so that the error associated with the selection is minimized. The best M clusters are determined by minimizing the mean square error with the constraint that the points associated with each cluster are spaced to conform to the predefined spacing.

In a preferred embodiment, for a block type of four equidistant colors, the error may be defined as a squared error along the analog curve, such as $$E^2 = \sum_{cluster0} (x_i - p_0)^2 + \sum_{cluster1} (x_i - ((2/3)p_0 + (1/3)p_1))^2 + \sum_{cluster2} (x_i - ((1/3)p_0 + (2/3)p_1))^2 + \sum_{cluster3} (x_i - p_1)^2$$

where E is the error for the particular grouping or clustering, $p_0$ and $p_1$ are the coded colors, and $x_i$ are the projected points on the optimal analog curve.

In instances where the block type indicates three equidistant colors, the error may be defined as a squared error along the analog curve, such as $$E^2 = \sum_{cluster0} (x_i - p_0)^2 + \sum_{cluster1} (x_i - ((1/2)p_0 + (1/2)p_1))^2 + \sum_{cluster2} (x_i - p_1)^2$$

where, again, E is the error for the particular grouping or clustering, $p_0$ and $p_1$ are the coded colors, and $x_i$ are the projected points on the optimal analog curve.

After the resulting 447 optimal codewords 390a are identified, they are forwarded to the bitmap construction module 340. The bitmap construction module 340 uses the codewords 390a to identify the M colors that may be specified or inferred from those codewords 390a. In a preferred embodiment, the bitmap construction module 340 uses the codewords 390a, e.g., CW0, CW1, to identify the three or four colors that may be specified or inferred from those codewords 390a.

The bitmap construction module 340 constructs a block bitmap 390b using the codewords 390a associated with the image block 260. Colors in the image block 260 are mapped to the closest color associated with one of the quantized colors specified by, or inferred from, the codewords 390a. The result is a color index, referenced as ID, per pixel in the block identifying the associated quantized color.

Information indicating the block type is implied by the codewords 390a and the bitmap 390b. In a preferred embodiment, the order of the codewords 390a CW0, CW1, indicate the block type. If a numerical value of CW0 is greater than a numerical value of CW1, the image block is a four color block. Otherwise, the block is a three color plus transparency block.

As discussed above, in a preferred embodiment, there are two image block types. One image block type has four equidistant colors, while the other image block type has three equidistant colors with the fourth color index used to specify that a pixel is transparent. For both image block types the color index is two bits.

The output of the bitmap construction module 340 is an encoded image block 390 having the M codewords 390a plus the bitmap 390b. Each encoded image block 390 is received by the encoded image composer 319 that, in turn, orders the encoded image blocks 390 in a file. In a preferred embodiment, the encoded image blocks 390 are ordered from left to right and from top to bottom in the same order as the blocks were broken down by the block decomposer 315. The ordered file having the encoded image blocks 390 is concatenated with the header information 385a that is derived from the header 380a of the original image 310 to generate the encoded image data 385 that is the image encoder system 220 output 320. The image encoder system 220 output 320 may be forwarded to the memory 115, the storage device 120, or the output device 130, for example.

The image encoder system 220 of the present invention advantageously reduces the effective data size of an image, for example, from 24-bits per pixel to 4-bits per pixel. Further, the present invention beneficially addresses transparency issues by allowing for codewords to be used with a transparency identifier.

Figure 5A:
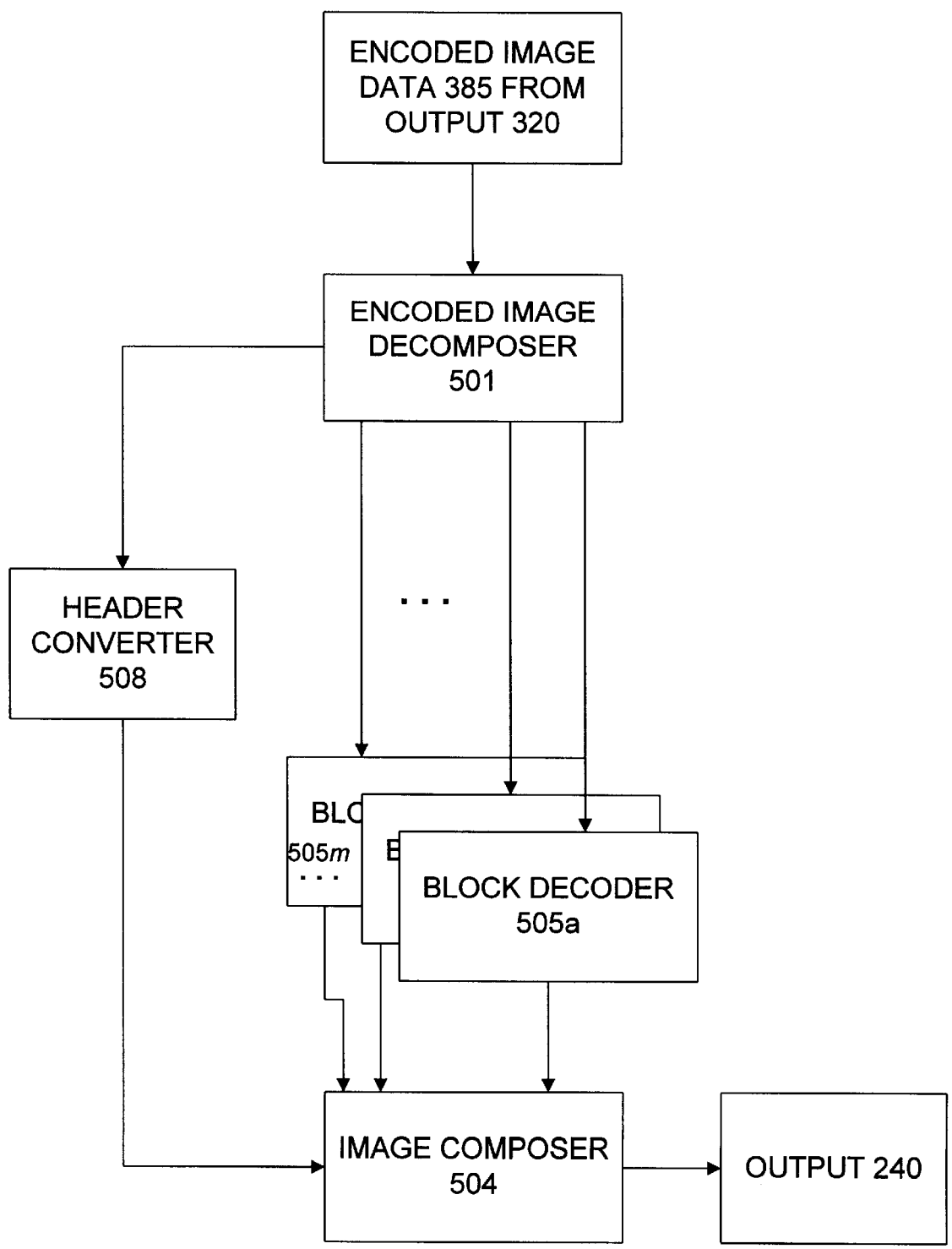
FIG. 5A is a block diagram of an image decoder system in accordance with the present invention.

FIG. 5A is a block diagram of an image decoder system 230 in accordance with the present invention. The image decoder system 230 includes an encoded image decomposing unit 501, a header converter 508, one or more block decoders 505 (505a–505m, where m is any positive integer value representing the last block decoder), and an image composer 504. The encoded image decomposer 501 is coupled to receive the encoded image data 385 that was output 320 from the image encoder system 220. The encoded image decomposer 501 is coupled to the one or more block decoders 505a–505m. The one or more block decoders 505a–505m are coupled to the image composer 504 that, in turn, is coupled to the output 240.

The encoded image decomposer 501 receives the encoded image data 385 and decomposes, or breaks, it into its header 385a and the encoded image blocks 390-1–390-R. The encoded image decomposer 501 reads the modified header 385a of the encoded image data 385 and forwards the modified header 385a to the header converter 508. The encoded image decomposer 501 also decomposes the encoded image data 385 into the individual encoded image blocks 390-1–390-R that are forwarded to the one or more block decoders 505a–505m.

The header converter 508 converts the modified header 385a to an output header. Simultaneously, the encoded image blocks 390-1–390-R are decompressed or decoded by the one or more block decoders 505a–505m. It is rioted that the each encoded image block 390 may be processed sequentially in one block decoder 505a or multiple encoded image blocks 390-1–390-R may be processed in parallel with one block decoder 505a–505m for each encoded image block 390-1–390-R. Thus, multiple block decoders 505a–505m allows for parallel processing that increases the processing performance and efficiency of the image decoder system 230.

The image composer 504 receives each decoded image block from the one or more block decoders 505a–505m and orders them in a file. Further, the image composer 504 receives the converted header from the header converter 508. The converted header and the decoded image blocks are placed together to generate output 240 data representing the original image 310.

Figure 5B:
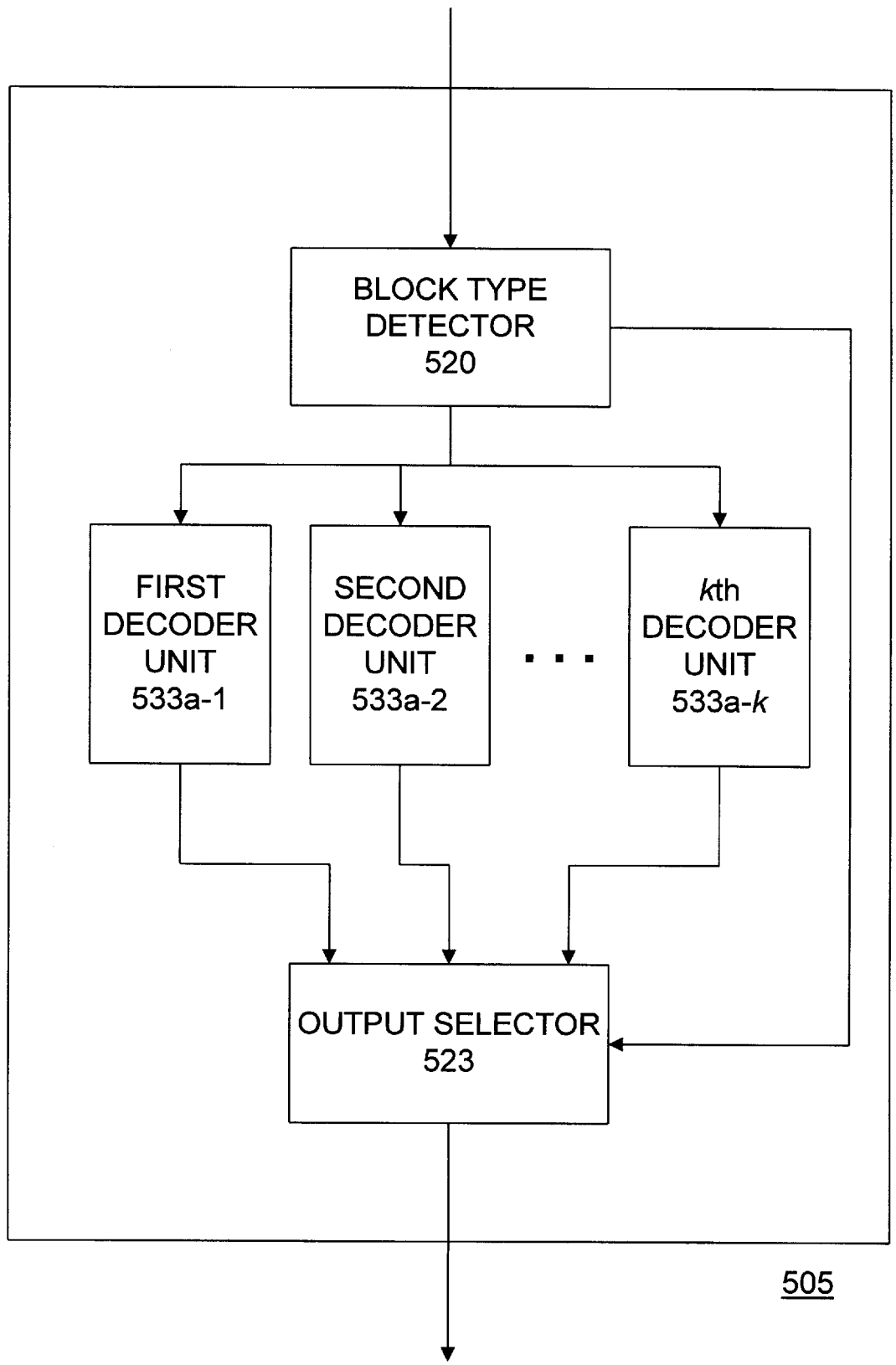
FIG. 5B is a block diagram of a first embodiment of a block decoder in accordance with the present invention.

FIG. 5B is a block diagram of a first embodiment of a block decoder 505 in accordance with the present invention.

Each block decoder 505a–505m includes a block type detector 520, one or more decoder units, e.g., 533a-l to 533a-k (k is any integer value), and an output selector 523. The block type detector 520 is coupled to the encoded image decomposer 501, the output selector 523, and each of the one or more decoder units, e.g., 533a-l–533a-k. Each of the decoder units, e.g., 533a-l–533a-k, is coupled to the output selector 523 that, in turn, is coupled to the image composer 504.

The block type detector 520 receives the encoded image blocks 390 and determines the block type for each encoded image block 390. Specifically, the block type detector 520 passes a selector signal to the output selector 523 that will be used to select an output corresponding to the block type detected. The block type is detected based on the codewords 390a. After the block type is determined, the encoded image blocks 390 are passed to each of the decoder units, e.g., 533a-l–533a-k. The decoder units, e.g., 533a-l–533a-k, decompress or decode each encoded image block 390 to generate the colors for the particular encoded image block 390. The decoder units, e.g., 533a-l–533a-k, may be c-channels wide (one channel for each color component (or pixel property) being encoded), where c is any integer value. Using the selector signal, the block type detector 520 enables the output selector 523 to output the color of the encoded image block 390 from one of the decoder units, e.g., 533a-l–533a-k that corresponds with the block type detected by the block type detector 520. Alternatively, using the selector signal, the appropriate decoder unit 533 could be selected so the encoded block is processed through that decoder unit only.

Figure 5C:
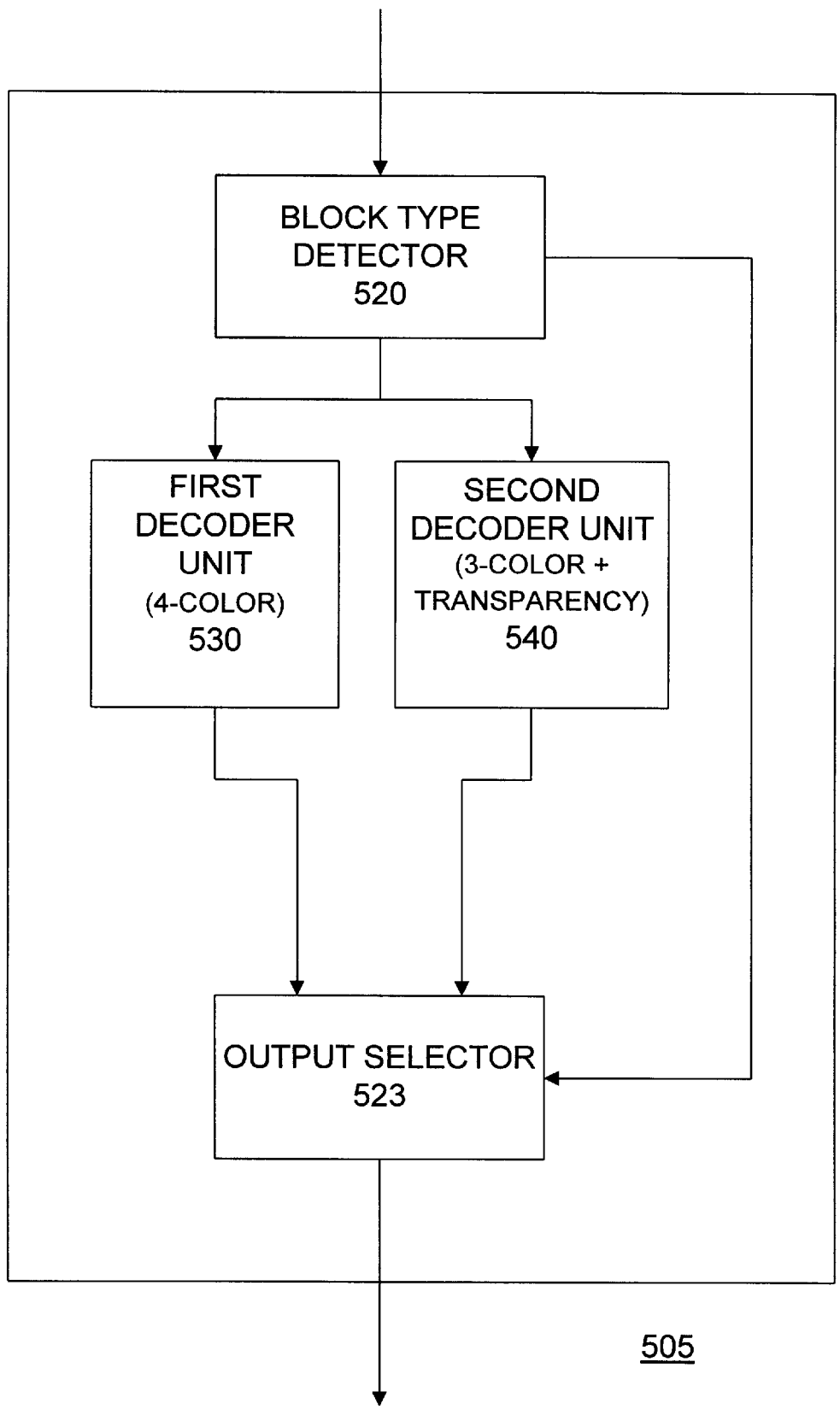
FIG. 5C is a block diagram of a second embodiment of a block decoder in accordance with the present invention.

FIG. 5C is a block diagram of a second embodiment of a block decoder 505 in accordance with the present invention. In a second embodiment, the block decoder 505 includes a block type detector 520, a first and a second decoder unit 530, 540, and the output selector 523. The block type detector 520 is coupled to receive the encoded image blocks 390 and is coupled to the first and the second decoder units 530, 540 and the output selector 523.

The block type detector 520 receives the encoded image blocks 390 and determines, by comparing the codewords 390a of the encoded image block 390, the block type for each encoded image block 390. For example, in a preferred embodiment, the block type is four quantized colors or three quantized colors and a transparency. Once the block type is selected and a selector signal is forwarded to the output selector 523, the encoded image blocks 390 are decoded by the first and the second decoder units 530, 540. The first and the second decoder units 530, 540 decode the encoded image block 390 to produce the pixel colors of each image block. The output selector 523 is enabled by the block type detector 520 to output the colors from the decoder unit 530, 540 that corresponds to the block type selected.

Figure 5D:
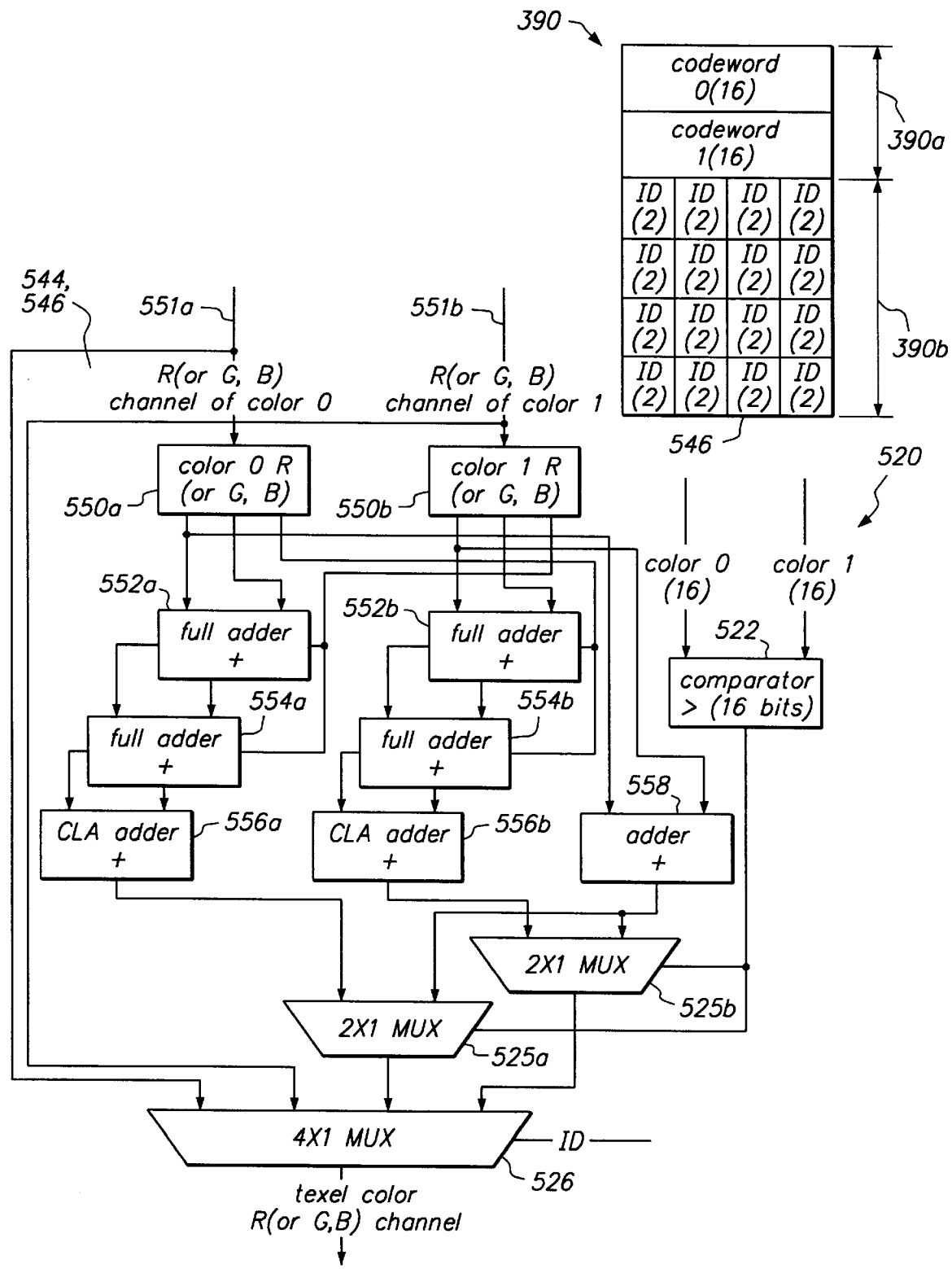
FIG. 5D is a logic diagram illustrating a first embodiment of a decoder unit in accordance with the present invention.

FIG. 5D is a logic diagram illustrating one embodiment of a decoder unit through a red-channel of the that decoder unit in accordance with the present invention. Specifically, the decoder unit is similar to the decoder units 530, 540 illustrated in FIG. 5C. Moreover, the functionality of each of those decoder units 530, 540 is merged into the single logic diagram illustrated in FIG. 5D. Further, those skilled in the art will understand that although described with respect to the red-channel of the decoder units 530, 540 the remaining channels, e.g., the green-channel and the blue-channel, in each decoder unit 530, 540 are similarly coupled and functionally equivalent.

The logic diagram illustrating the decoder units 530, 540 is shown to include portions of the block type detector 520, for example a comparator unit 522. The comparator unit 522 works with a first 2×1 multiplexer 525a and a second 2×1 multiplexer 525b. The comparator unit 522 is coupled to the first and the second 2×1 multiplexers 525a, 525b. Both 2×1 multiplexers 525a, 525b are coupled to a 4×1 multiplexer 526 that serves to select the appropriate color to output.

The red-channel 544, 546 of the first decoder unit 530 includes a first and a second red-channel line 551a, 551b and a first and a second red-color block 550a, 550b. Along the path of each red-color block 550a, 550b is a first full adder 552a, 552b, a second full adder 554a, 554b, and a CLA ("carry-look ahead") adder 556a, 556b. The first and the second red-channel lines 551a, 551b are coupled to the first and the second red-color blocks 550a, 550b, respectively. Each red-color block 550a, 550b is coupled to the first full adder 552a, 552b associated with that red-color block 550a, 550b. Each first full adder 552a, 552b is coupled to the respective second full adder 554a, 554b. Each second full adder 554a, 554b is coupled to the respective CLA adder 556a, 556b.

The second decoder unit 540 comprises the first and the second red-channel lines 551a, 551b and the respective first and second red-color blocks 550a, 550b and an adder 558. The first and the second channel lines 551a, 551b are coupled to their respective red-color blocks 550a, 550b as described above. Each red-color block 550a, 550b is coupled to the adder 558.

The CLA adder 556a from the path of the first red-color block 550a of the first decoder unit 530 is coupled to the first 2×1 multiplexer 525a and the CLA adder 556b from the path of the second red-color block 550b of the first decoder unit 530 is coupled to the second 2×1 multiplexer 525b. The adder 558 of the second decoder unit 540 is coupled to both the first and the second 2×1 multiplexers 525a, 525b.

The 4×1 multiplexer 526 is coupled the first and the second red-channel lines 551a, 551b, as well as to the first and the second 2×1 multiplexers 525a, 525b. The 4×1 multiplexer 526 is also coupled to receive a transparency indicator signal that indicates whether or not a transparency (no color) is being sent. The 4×1 multiplexer 526 selects a color for output based on the value of the color index, referenced as the ID signal, that references the associated quantized color for an individual pixel of the encoded image block 390.

Figure 6A:
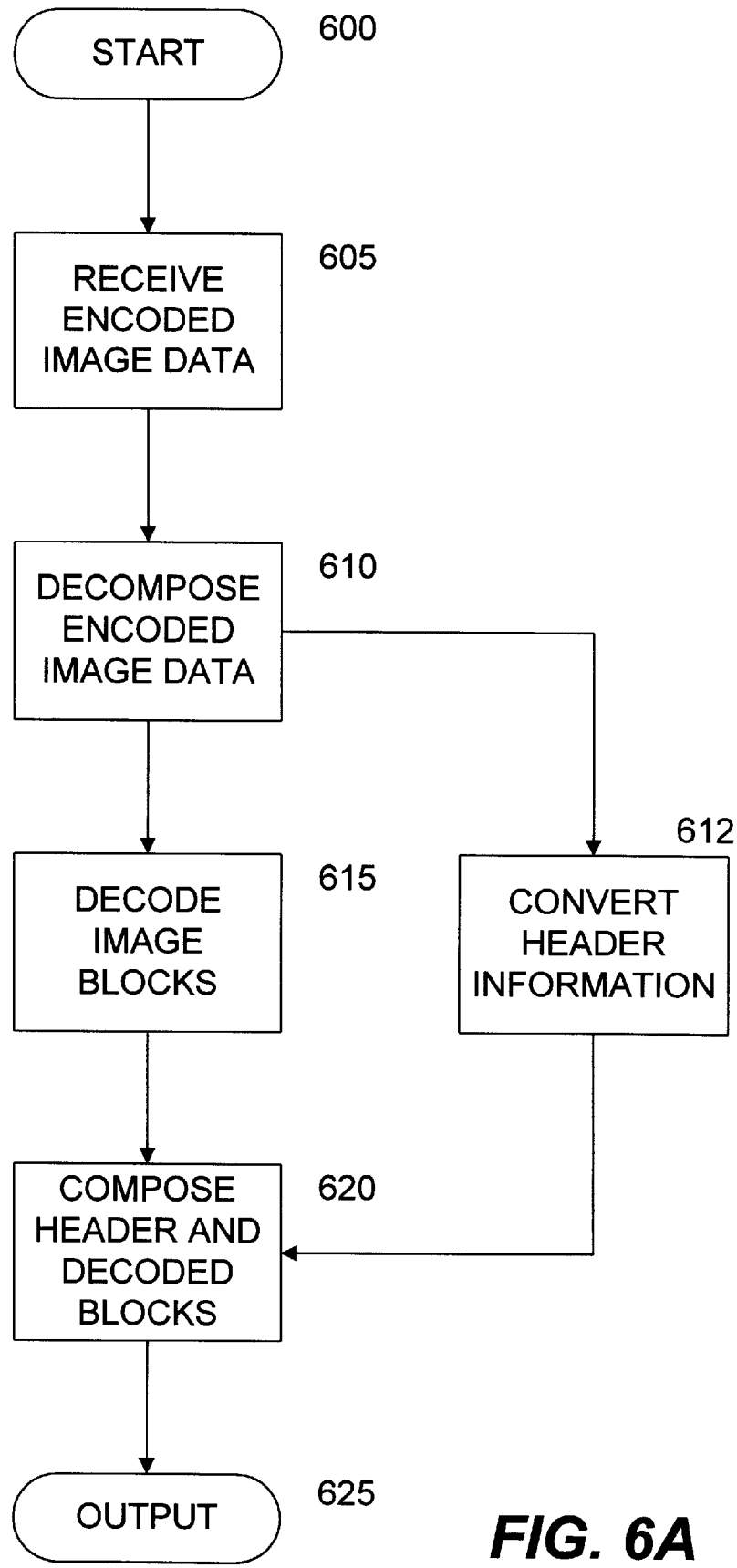
FIGS. 6A–6B are flow diagrams illustrating a decoding process in accordance with the present invention.

FIG. 6A is a flow diagram illustrating operation of the decoder system 230 in accordance with the present invention. For purposes of illustration only, the process for the decoder system 230 will be described with a single block encoder 505 having two decoding units, e.g., 530, 540. Those skilled in the art will recognize that the process is functionally equivalent for decoder systems having more than one block decoder 505 and more than one decoder units, e.g., 533a-l–533a-k.

The process starts 600 with the encoded image decomposer 501 receiving 605 the encoded, or compressed, image data 385 from the encoder system 220, for example, through the memory 115 or the storage device 120. The encoded image decomposer 501 decomposes 610 the encoded image data 385 by forwarding the modified header 385a to the header converter 508. In addition, the encoded image decomposer 501 also decomposes 610 the encoded image data 385 into the individual encoded image blocks 390-1–390-R.

The header converter 508 converts 612 the header information to generate an output header that is forwarded to the image composer 504. Simultaneously, the one or more block decoders 505a–505m decodes 615 the pixel colors for each encoded image block 390. It is again noted that each encoded image block 390 may be decoded 615 sequentially in one block decoder 505a or multiple encoded image blocks 390-1–390-R may be decoded 615 in parallel in multiple block decoders 505a–505m, as described above. The process for decoding the encoded image blocks 390 is further described in FIG. 6B. Each decoded 615 image block is then composed 620 into a data file with the converted 612 header information by the image composer 504. The image composer 504 generates the data file as an output 625 that represents the original image 310.

Figure 6B:
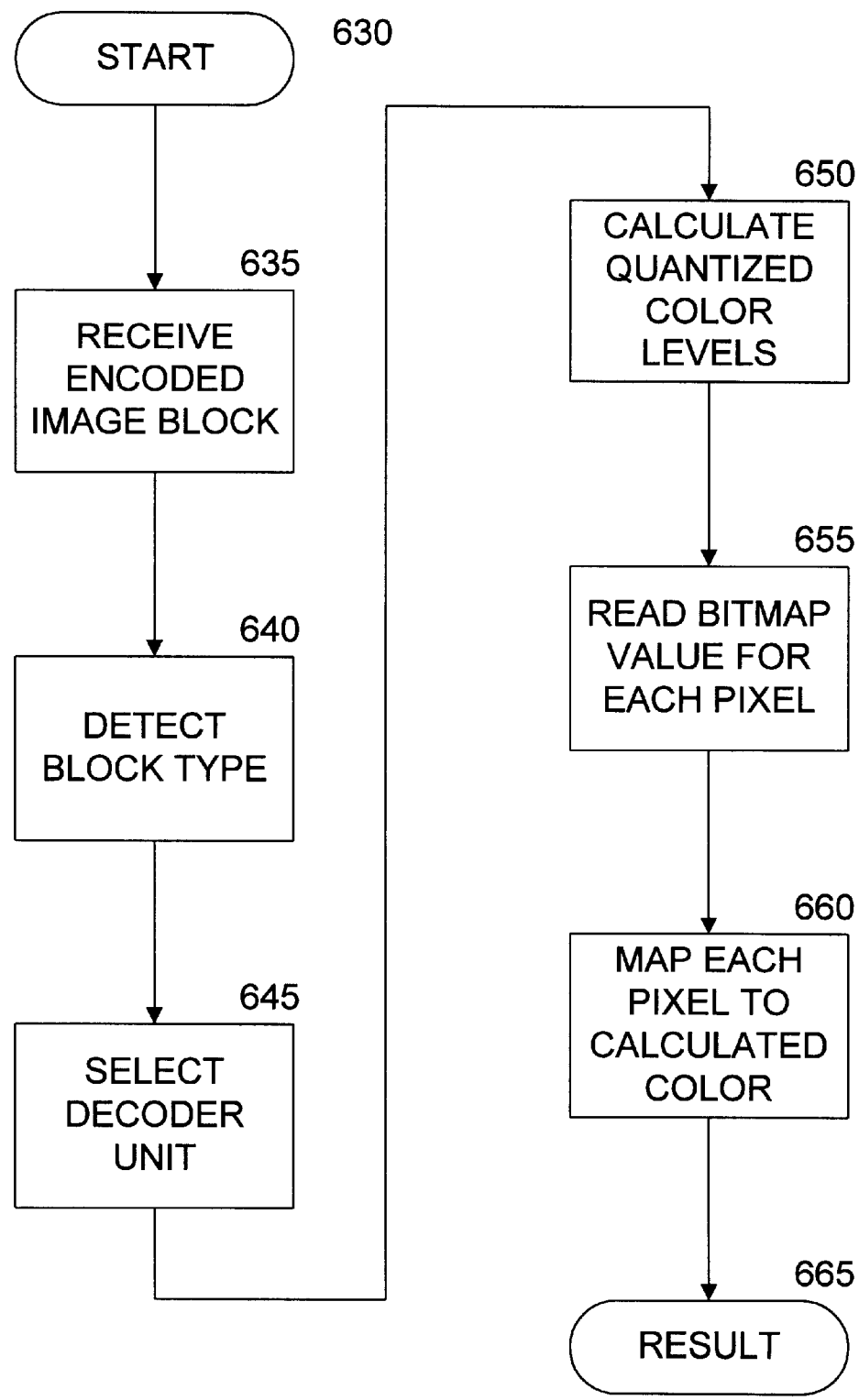

FIG. 6B is a flow diagram illustrating operation of the block encoder 505 in accordance with the present invention. Once the process is started 630, each encoded image block 390 is received by the block decoder 505 and the block type for each encoded image block 390 is detected 640. Specifically, for a preferred embodiment the first and the second codewords 390a, CW0, CW1, respectively, are received 635 by the block type detector 520 of the block decoder 505. As discussed above, comparing the numerical values of CW0 and CW1 reveals the block type.

In addition, the first five bits of each codeword 390a, e.g., CW0, CW1, that represent the red-channel color are received by the red-channel 545 of each of the first and the second decoder units 530, 540, the second 6-bits of each codeword 390a CW0, CW1 that represent the green-channel color are received by the green-channel of each of the first and the second decoder units 530, 540, and the last 5-bits of each codeword 390a CW0, CW1 that represent the blue-channel color are received by the blue-channel of each of the first and the second decoder units 530, 540.

The block type detector 520 detects 640 the block type for an encoded image block 390. Specifically, the comparator 522 compares the first and the second codewords 390a, CW0, CW1, and generates a flag signal to enable the first 2×1 multiplexers 525a or the second 2×1 multiplexers 525b which, in turn, selects 645 either the first decoding unit 530 or the second decoding unit 540, respectively. The process then calculates 650 the quantized color levels for the decoder units 530, 540.

To calculate 650 the quantized color levels, the first decoding unit 530 calculates the four colors associated with the two codewords 390a, CW0, CW1, using the following relationship:

CW0=first codeword=first color;
CW1=second codeword=second color;
CW2=third color=($2/3$)CW0+($1/3$)CW1;
CW3=fourth color=($1/3$)CW0+($2/3$)CW1.

In one embodiment, the first decoder unit 530 may estimate the above equations for CW2 and CW3, for example, as follows:

CW2=($5/8$)CW0+($3/8$)CW1; and
CW3=($3/8$)CW0+($5/8$)CW1. The red-color blocks 550a, 550b serve as a one-bit shift register to get ($1/2$)CW0 or ($1/2$)CW1 and each full adder 552a, 552b, 554a, 554b also serves to shift the signal left by 1-bit. Thus, the signal from the first full adders 552a, 552b is ($1/4$)CW0 or ($1/4$)CW1, respectively, because of a two-bit overall shift and the signal from the second full adders 554a, 554b is ($1/8$)CW0 or ($1/8$)CW1, respectively, because of a three-bit overall shift. These values allow for the above approximations for the color signals.

The second decoder unit 540 calculates 650 three colors associated with the codewords 390a, CW0, CW1, and includes a fourth signal that indicates a transparency is being passed. The second decoder unit 540 calculates colors, for example, as:

CW0=first codeword=first color;
CW1=second codeword=second color;
CW3=third color=($1/2$)CW0+($1/2$)CW1; and
T=Transparency.

In one embodiment the second decoder unit 540 has no approximation because the signals received from the red-color blocks 550a, 550b is shifted left by one-bit so that the color is already calculated to ($1/2$)CW0 and ($1/2$)CW1, respectively.

After the quantized color levels for the selected 645 decoder unit 530, 540 have been calculated 650, each bitmap value for each pixel is read 655 from the encoded image data block 385. As each index is read 655 it is mapped 660 to one of the four calculated colors if the first decoder unit 530 is selected 645 or one of the three colors and transparency if the second decoder unit 540 is selected. The mapped 660 colors are selected by the 4×1 multiplexer 526 based on the value of the ID signal from the bitmap 390b of the encoded image block 390. As stated previously, a similar process occurs for selection of colors in the green-channel and the blue-channel.

As the colors are output from the red-, green-, and blue-channels, the output is received by the image composer 504. The image composer 504 orders the output from the block encoders 505 in the same order as the original image 310 was decomposed. The resulting 665 image that is output from the image decoder system 230 is the original image that is forwarded to an output source 240, e.g., a computer screen, which displays that image.

Figure 7A:
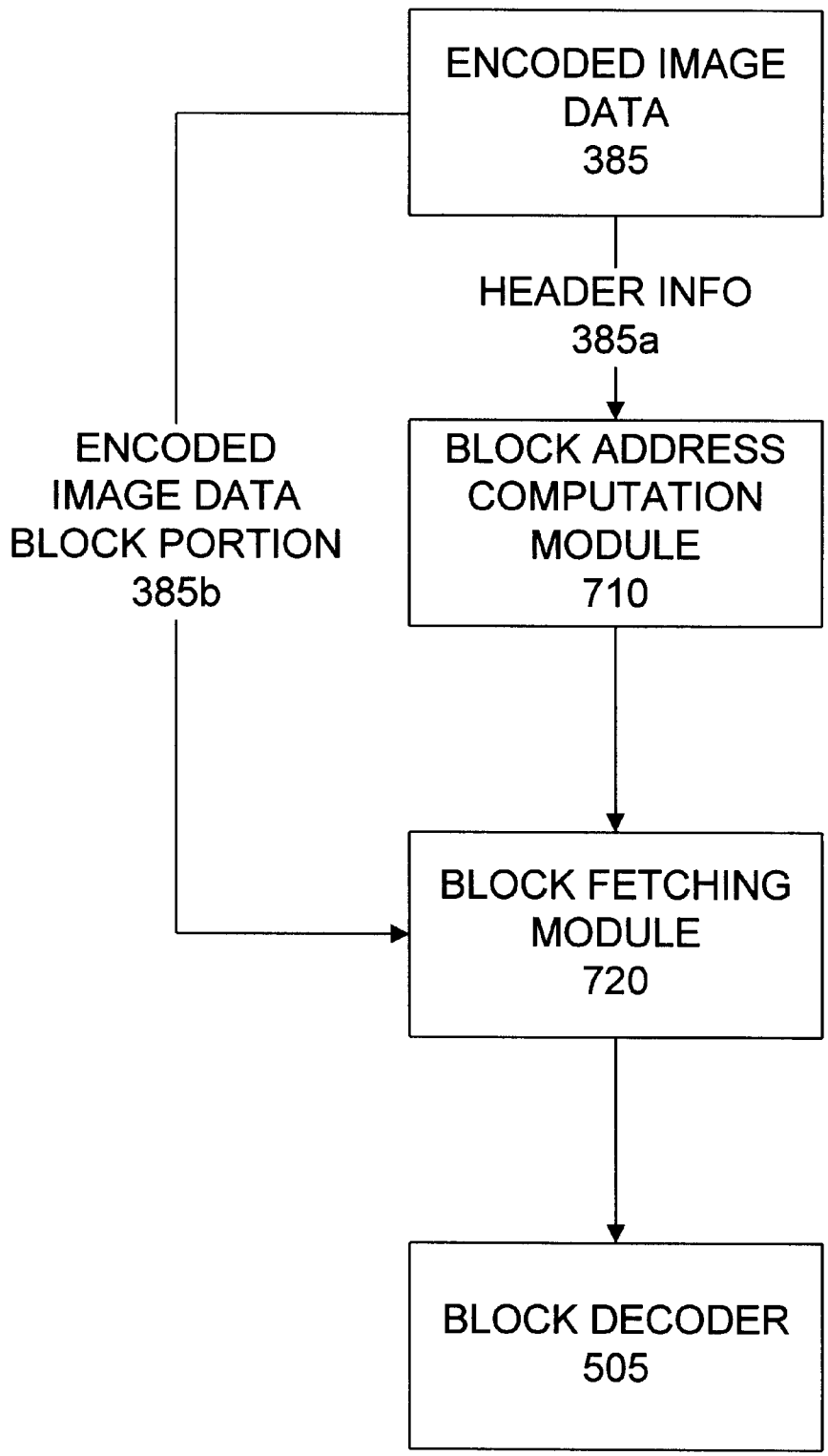
FIG. 7A is a block diagram of a subsystem for random access to a pixel or an image block in accordance with the present invention.

The system and method of the present invention beneficially allows for random access to any desired image block 260 within an image, and any pixel 270 within an image block 260. FIG. 7A is a block diagram of a subsystem 700 that provides random access to a pixel 270 or an image block 260 in accordance with the present invention.

The random access subsystem 700 includes a block address computation module 710, a block fetching module 720, and the one or more block decoders 505. The block address computation module 710 is coupled to receive header information 385a of the encoded image data 385. The block address computation module 710 is also coupled to the block fetching module 720. The block fetching module 720 is coupled to receive the encoded image block portion 390-1-R of the encoded image data 385. The block fetching module 720 is also coupled to the block decoders 505.

Figure 7B:
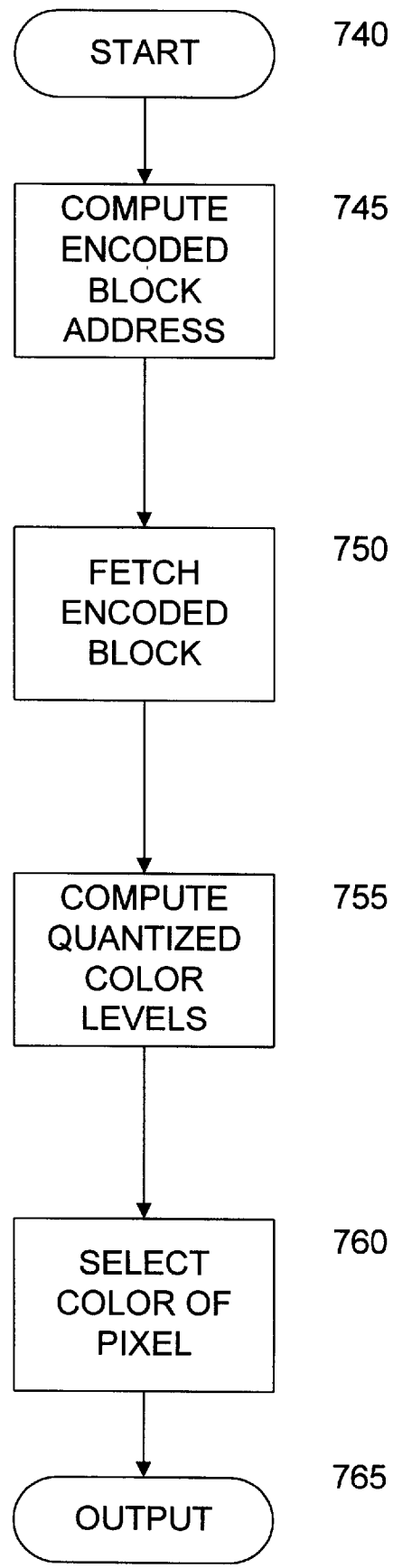
FIG. 7B is a flow diagram illustrating random access to a pixel or an image block in accordance with the present invention.

FIG. 7B is a flow diagram illustrating a process of random access to a pixel 270 or an image block 260 using the random access subsystem 700 in accordance with the present invention. When particular pixels 270 have been identified for decoding, the process starts 740 with the image decoder system 230 receiving the encoded image data 385. The modified header 385a of the encoded image data 385 is forwarded to the block address computation module 710 and the encoded image block portion 390-1-R of the encoded image data 385 is forwarded to the block fetching module 720.

The block address computation module 710 reads the modified header 385a to compute 745 the address of the encoded image block portion 390-1-R having the desired pixels 270. The address computed 745 is dependent upon the pixel coordinates within an image. Using the computed 745 address, the block fetching module 720 identifies the encoded image block 390 of the encoded image block portion 390-1-R that has the desired pixels 270. Once the encoded image block 390 having the desired pixels 270 has been identified, only the identified encoded image block 390 is forwarded to the block decoders 505 for processing.

Similar to the process described above in FIG. 6B, the block decoders 505 compute 755 the quantized color levels for the identified encoded image blocks 390 having the desired pixels. After the quantized color levels have been computed 755, the color of the desired pixel is selected 760 and output 765 from the image decoder system 230.

Random access to pixels 270 of an image block 260 advantageously allows for selective decoding of only needed portions or sections of an image. Random access also allows the image to be decoded in any order the data is required. For example, in three-dimensional texture mapping only portions of the texture may be required and these portions will generally be required in some non-sequential order. Thus, the present invention increases processing efficiency and performance when processing only a portion or section of an image.

The present invention beneficially encodes, or compresses, the size of an original image 310 from 24-bits per pixel to an aggregate 4-bits per pixel and then decodes, or decompresses the encoded image data 385 to get a representation of the original image 310. Further, the claimed invention uses, for example, two base points or codewords from which additional colors are derived so that extra bits are not necessary to identify a pixel 270 color.

Moreover, the present invention advantageously accomplishes the data compression on an individual block basis with the same number of bits per block so that the compression rate can remain fixed. Further, because the blocks are of fixed size with a fixed number of pixels 270, the present invention beneficially allows for random access to any particular pixel 270 in the block. The present invention provides for an efficient use of system resources because entire blocks of data are not retrieved and decoded to display data corresponding to only a few pixels 270.

In addition, the use of a fixed-rate 64-bit data blocks in the present invention provides the advantage off having simplified header information that allows for faster processing of individual data blocks. Also, a 64-bit data block allows for data blocks to be processed rapidly, e.g., within one-clock cycle, as the need to wait unit a full data string is assembled is eliminated. Further, the present invention also reduces the microchip space necessary for a decoder system because the decoder system only needs to decode each pixel to a set of colors determined by, e.g., the two codewords.

While particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. In an image processing system, a system for encoding an image, comprising:

an image decomposer, coupled to receive an image, for breaking the image into one or more image blocks;

at least one block encoder, each block encoder coupled to the image decomposer, for compressing each image block to generate an encoded image block; and an encoded image composer, coupled to each block encoder, for ordering the encoded image blocks into a data file, wherein each block encoder includes a color quantizer, coupled to receive an image block identifiable as a block type, for generating a first and a second codeword from which at least one quantized color is derived, the color quantizer comprising a curve selection module, coupled to the block type, for computing the optimal analog curve for the block type, the first codeword and the second codeword derived from the analog curve.

2. The system for encoding in claim 1, further comprising a header converter, coupled to the image decomposer and the encoded image composer, for receiving a header from the image, modifying the header, and outputting the modified header with the data file.

3. The system for encoding in claim 1, wherein each block encoder further comprises:

a bitmap construction module, coupled to the color quantizer, for mapping the colors of an image block to one of the at least one quantized colors.

4. The system for encoding in claim 1, wherein the color quantizer further comprises:

a block type module, coupled to receive the image block, for selecting the identifiable block type for the image block; and a codeword generation module, coupled to the curve selection module, for generating the first codeword and the second codeword from the analog curve.

5. In an image processing system, a system for decoding a compressed image, comprising:

an encoded image decomposer, coupled to receive encoded image data file having at least one compressed image block, for breaking the encoded image data file into individual compressed image blocks, each compressed image block having at least one associated codeword, each codeword generated through selecting a block type for an original image block comprising the compressed image block, computing an analog curve for the block type, selecting a partition along the analog curve for the computed analog curve, and computing the set of codewords for the partition;

at least one block decoder, coupled to the encoded image decomposer, for decompressing the compressed image blocks; and an image composer, coupled to each block decoder, for ordering the decompressed image blocks in an output file.

6. The system for decoding in claim 5, further comprising a header converter, coupled to the encoded image decomposer and the image composer, for receiving a modified header associated with the encoded image data file, generating an output header, and outputting the output header with the output file.

7. The system for decoding in claim 6, wherein each block decoder further comprises:

a block type detector, coupled to the encoded image decomposer, for selecting a block type for each compressed image block;

a first and a second decoder unit, each decoder unit coupled to the block type detector, for decompressing each compressed image block; and an output selector, coupled to the block type detector and each decoder unit, for outputting the image block from the decoder unit in response to the block type selected by the block type detector.

8. In an image processing system a system for encoding and decoding an image, comprising: an image encoder system, having a block decomposer for breaking the image into a fixed number of image blocks, each image block having a fixed number of pixels, at least one block encoder, each coupled to the block decomposer, for selecting at least one codeword for each block from which M quantized colors are derived, mapping each pixel for each block to one of the M quantized colors, and outputting the codewords and mapped pixels for each block as an encoded image block, where M is an integer value, and an encoded image composer, coupled to each block encoder, for ordering each encoded image block in an encoded data file, wherein each block encoder includes a color quantizer for examining the image block, including a block type, and generating the at least one codeword from which the M quantized colors are derived, the color quantizer comprising a curve selection module, coupled to receive the block type, for selecting an analog curve in a color space from the selected color set, the at least one codeword derived from the analog curve; and an image decoder system, coupled to the image encoder system, having an encoded image decomposer, coupled to receive the encoded data file, for decomposing, the encoded data file into the encoded image blocks;

at least one block decoder, each coupled to the encoded image decomposer, for decoding each encoded image block using the codewords to map each pixel of the encoded block to one of the M quantized colors to produce a decoded image block, and an image composer, coupled to each block decoder, for ordering the decoded image blocks in an output file.

9. The image processing system in claim 8, wherein each block encoder further comprises:

a bitmap construction module, coupled to the codeword selection module, for mapping each pixel of the image block to one of the M quantized colors.

10. The image processing system in claim 9, wherein the color quantizer further comprises:

a block type module, coupled to receive the image blocks, for selecting the block type for each examined image block, the block type representing a predefined color set; and a codeword generation module, coupled to the curve selection module, for providing the at least one codeword from the analog curve.

11. The image processing system in claim 8, wherein each block decoder comprises:

a block type detector, coupled to receive the encoded data block, for selecting the block type for decoding the encoded image block; and a first decoder unit and a second decoder unit, each coupled to the block type detector, each decoder unit decoding the encoded image block to restore one of the M quantized colors derived from the at least one codeword.

12. The image processing system in claim 11, wherein each block decoder further comprises an output selector, the output selector coupled to each decoder unit and the block type detector, for outputting the restored color of the M quantized colors from one of the decoder units in response to the block type selected for the encoded image block.

13. In an image processing system, a method for generating an encoded image of an original image having a header, comprising:

converting the header to a modified header;

decomposing the original image into image blocks;

encoding each image block to generate an encoded image block for each image block, including selecting a set of codewords, the set having at least one codeword, for representing a property value for an image block selecting at least one block type, the selecting the set of codewords further including computing an optimal analog curve for each selected block type, selecting at least one partition along the analog curve for each computed analog curve, and computing the set of codewords for each selected partition; and composing the modified header and each encoded image block in a file to generate the encoded image.

14. The method for generating an encoded image in claim 13, wherein encoding each image block further comprises:

quantizing colors for an image block for representing the image block, each quantized color derived from the set of codewords.

15. The method for generating an encoded image in claim 14, wherein selecting the set of codewords further comprises:

computing an error for each computed set of codewords; and outputting the block type and set of codewords producing the minimum computed error for each computed set of codewords.

16. In an image processing system, a method for generating an original image from an encoded image including a modified header and at least one encoded image block, comprising:

receiving the encoded image data;

decomposing the encoded image into the modified header and the individual encoded image blocks;

reading the modified header to generate an output header;

decoding each individual encoded image block to generate a decoded image block, including receiving each individual encoded image block, including a plurality of codewords, and a bitmap of at least one pixel, the plurality of codewords derived through selecting a block type for an original image block of the encoded image block, computing an analog curve for the block type, selecting a partition along the analog curve for the computed analog curve, and computing the plurality of codewords for the partition; and composing the output header and the individual decoded image blocks to generate an output file of the original image.

17. The method for generating an original image in claim 16, wherein the decoding each individual image block further comprises:

detecting the block type for the encoded image block to select a decoder unit;

calculating at least one quantized color level for the encoded image block using the set of codewords; and mapping each pixel of the bitmap to one of the calculated quantized color levels for the encoded image block.

18. In an image processing system, a method for compressing an original image and generating an output image representing the original image from the compressed original image, comprising:

breaking the original image into a fixed number of image blocks, each image block having an associated color and a fixed number of pixels;

selecting a set of codewords, the set having at least one codeword, for each image block to represent colors in a color space, including selecting at least one block type for each image block, computing an optimal analog curve for each selected block type, selecting at least one partition along the analog curve for each computed analog curve, and computing the set of codewords for each selected partition;

quantizing colors for each image block, the quantized colors derived from the set of codewords;

mapping each pixel to one of the quantized colors to produce a bitmap;

generating an encoded image block for each image block, each encoded image block comprising the set of codewords and the bitmap;

composing the each encoded image block into an encoded image data file;

receiving the encoded image data file at a decoder system;

breaking the encoded image data file into the encoded image blocks;

decoding each encoded image block using the set of codewords to map each pixel of each encoded image block with a restored quantized color; and composing the restored quantized colors in an output file to output an image representing the original image.

19. The method for compressing an original image and generating an output image representing the original image from the compressed original image in claim 18, wherein the selecting the set of codewords further comprises:

computing an error for each of the sets of codewords; and outputting the block type and the set of codewords producing the minimum computed error.

20. The method for compressing an original image and generating an output image representing the original image from the compressed original image in claim 18, wherein decoding each encoded image block further comprises:

receiving the individual encoded image block, including the set of codewords, and a bitmap having at least one pixel;

detecting the block type for the encoded image block to select a decoder unit;

calculating the at least one quantized color level for the encoded image block using the set of codewords; and mapping each pixel of the bitmap to one of the calculated quantized colors for the encoded image block.

21. A system for processing any identified pixel from an encoded image data file having header information, including at least one codeword derived through computation of an analog curve from a selected original image block, and an encoded image block portion including at least one encoded image block derived from an original image block, the system comprising:

a block address computation module, coupled to receive each codeword from the header information, for computing an address of an encoded image block having the identified pixel;

a block fetching module, coupled to receive the encoded image block portion and the computed address, for fetching the encoded image block having the identified pixel; and a block decoder, coupled to receive the fetched encoded image block, for decoding the image block to generate a quantized color associated with the identified pixel.

22. In an image processing system, a method for processing any identified pixel of an encoded image data file having a header, including at least one codeword derived through calculation of an analog curve associated with an original image block, and an encoded image block portion including at least one encoded image block associated with an original image block, the method comprising:

computing an address for an encoded image block having the identified pixel, the address computed from the at least one codeword for the encoded image block;

fetching the encoded image block using the computed address;

computing quantized color levels for the fetched encoded image block; and selecting a color of the identified pixel from the quantized color levels to output.

* * * * *